US012787494B2

(12) United States Patent
Ishizaki

(10) Patent No.: US 12,787,494 B2
(45) Date of Patent: Nov. 3, 2026

(54) METHOD FOR MANUFACTURING BONDED SEMICONDUCTOR WAFER

(71) Applicant: SHIN-ETSU HANDOTAI CO., LTD., Tokyo (JP)

(72) Inventor: Junya Ishizaki, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 357 days.

(21) Appl. No.: 18/704,613

(22) PCT Filed: Oct. 14, 2022

(86) PCT No.: PCT/JP2022/038473
§ 371 (c)(1),
(2) Date: Apr. 25, 2024

(87) PCT Pub. No.: WO2023/074423
PCT Pub. Date: May 4, 2023

(65) Prior Publication Data
US 2026/0164852 A1 Jun. 11, 2026

(30) Foreign Application Priority Data
Oct. 28, 2021 (JP) ................................ 2021-176922

(51) Int. Cl.
*H10H 20/01* (2025.01)

(52) U.S. Cl.
CPC ........ *H10H 20/018* (2025.01); *H10H 20/019* (2025.01)

(58) Field of Classification Search
CPC .. H10H 20/018; H10H 20/019; H10H 20/032; H10H 20/034; H10H 20/84; H10P 95/11
See application file for complete search history.

(56) References Cited

U.S. PATENT DOCUMENTS

2015/0187652 A1 7/2015 Yamamoto et al.
2022/0367510 A1* 11/2022 Liu ....................... H10B 41/27

FOREIGN PATENT DOCUMENTS

JP 2013-004632 A 1/2013
JP 2021-027301 A 2/2021
(Continued)

OTHER PUBLICATIONS

Dec. 13, 2022 International Search Report issued in International Patent Application No. PCT/JP2022/038473.
(Continued)

*Primary Examiner* — Elias Ullah
(74) *Attorney, Agent, or Firm* — Oliff PLC

(57) ABSTRACT

A method for manufacturing a bonded semiconductor wafer, the method includes manufacturing an epitaxial wafer by epitaxially growing a sacrificial layer and an epitaxial layer having a semiconductor functional layer on a starting substrate, forming a device isolation groove by a selective etching method so as to expose the sacrificial layer, forming a passivation film on at least an exposed surface of the sacrificial layer, producing a bonded substrate by bonding the epitaxial layer to a to-be-bonded substrate being transparent via a thermosetting bonding material, removing the passivation film of the bonded substrate by etching, and separating the starting substrate and the epitaxial layer by etching the sacrificial layer by supplying an etchant to the device isolation groove of the bonded substrate.

18 Claims, 19 Drawing Sheets

(56) References Cited

FOREIGN PATENT DOCUMENTS

| | | | |
|---|---|---|---|
| WO | 2014/020906 | A1 | 2/2014 |
| WO | 2021/024768 | A1 | 2/2021 |

OTHER PUBLICATIONS

Apr. 30, 2024 International Preliminary Report on Patentability issued in International Patent Application No. PCT/JP2022/038473.

* cited by examiner

[FIG. 1]
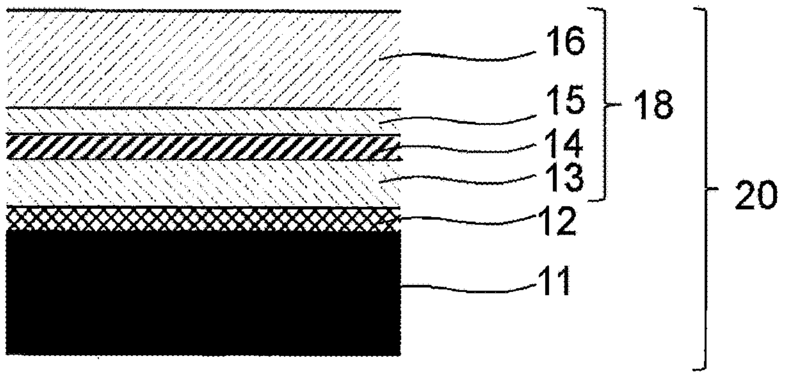
[FIG. 2]
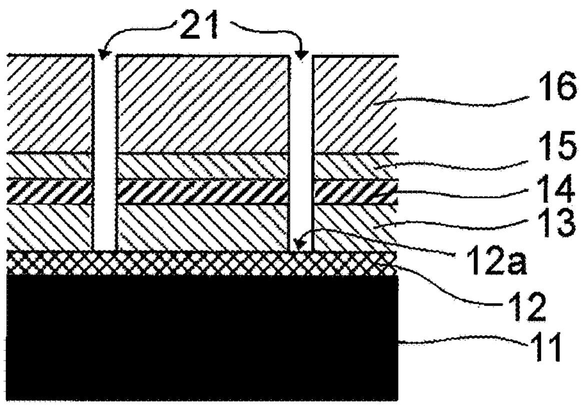
[FIG. 3]
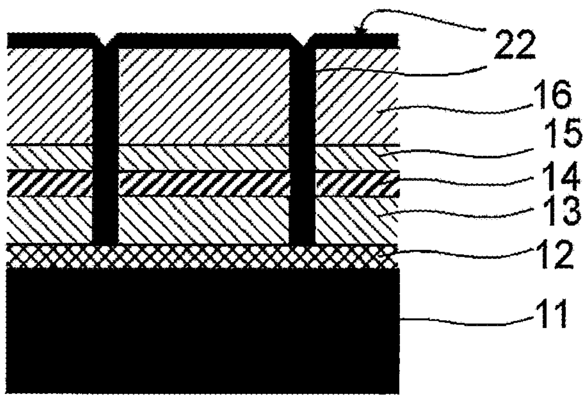
[FIG. 4]
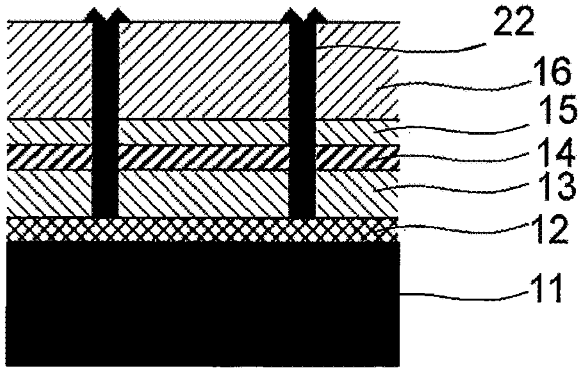

[FIG. 5]
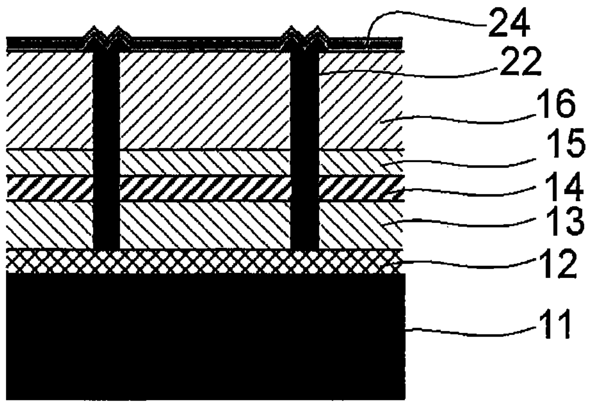
[FIG. 6]
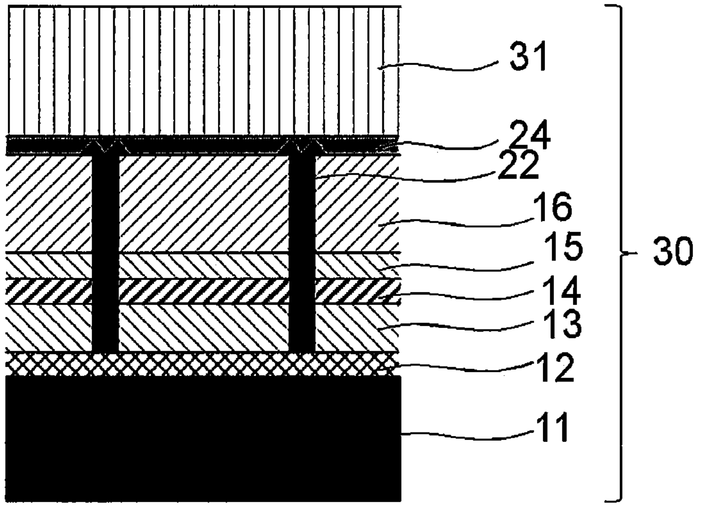
[FIG. 7]
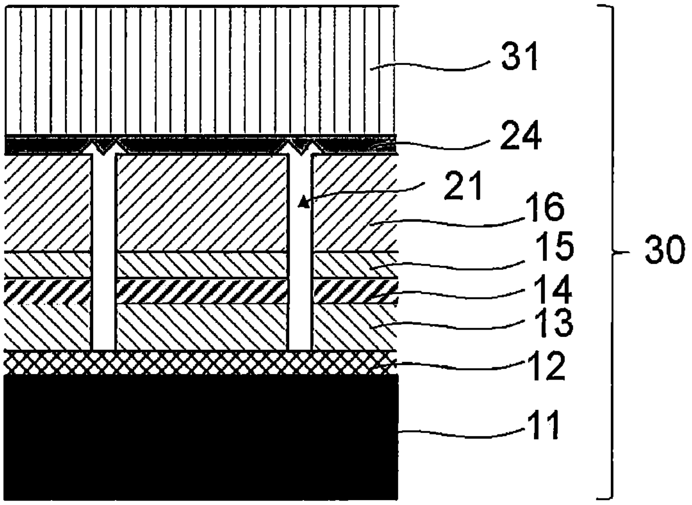

[FIG. 8]
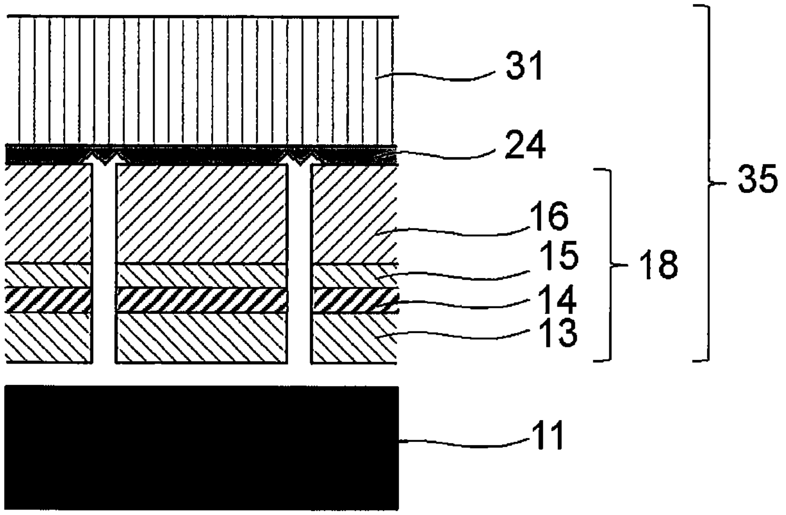
[FIG. 9]
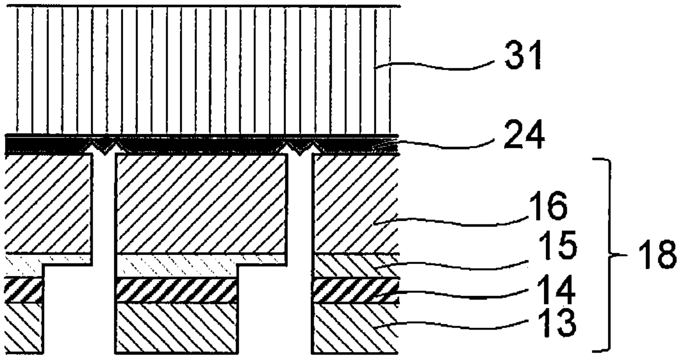
[FIG. 10]
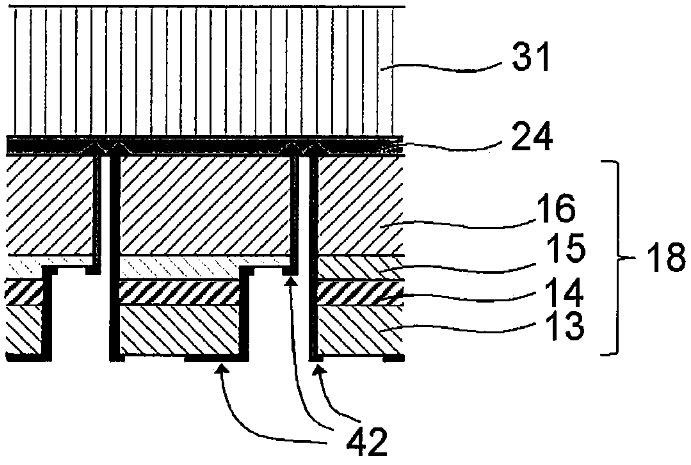

[FIG. 11]
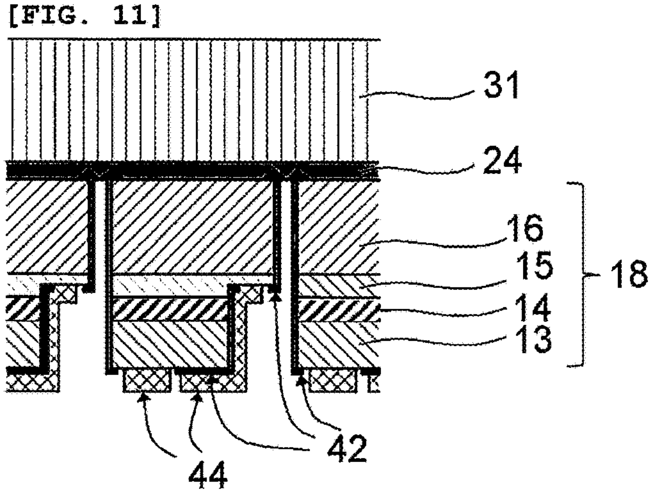
[FIG. 12]
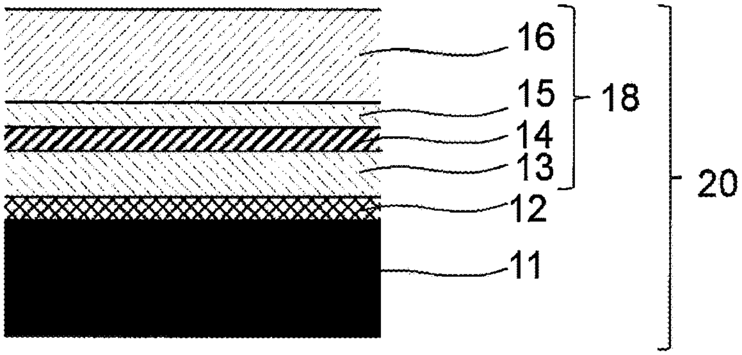
[FIG. 13]
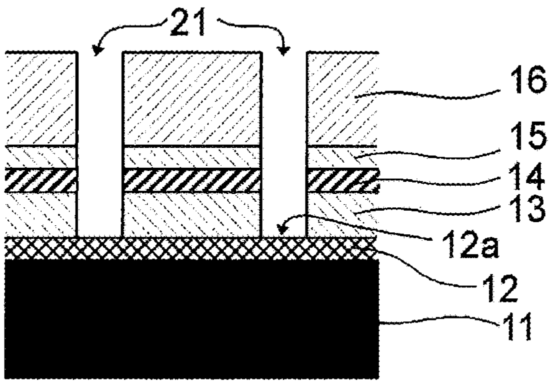
[FIG. 14]
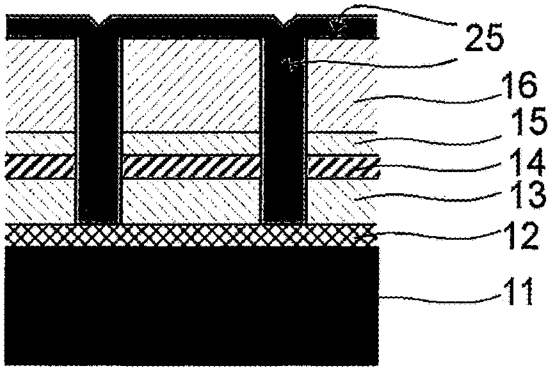

[FIG. 15]
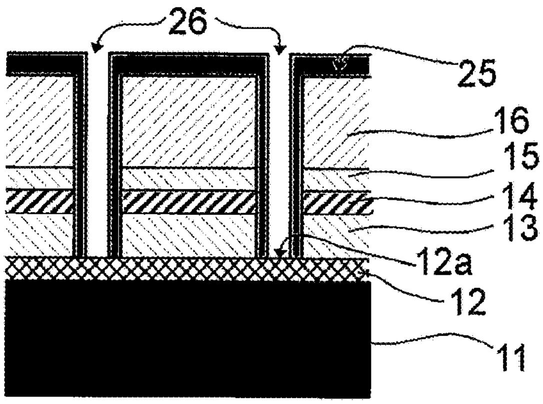
[FIG. 16]
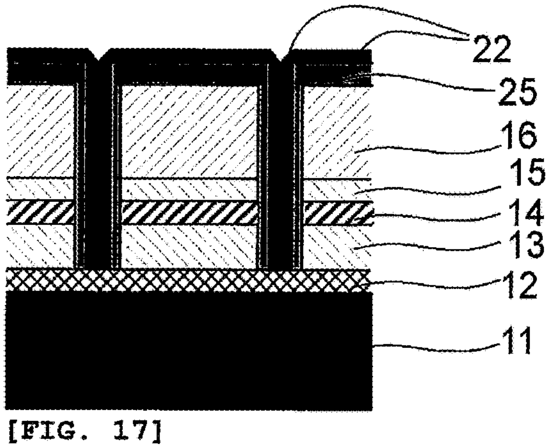
[FIG. 17]
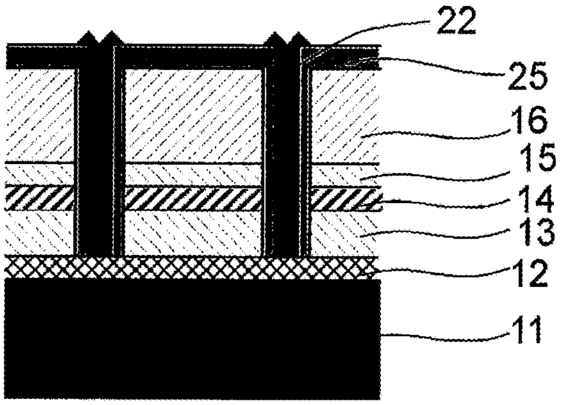
[FIG. 18]
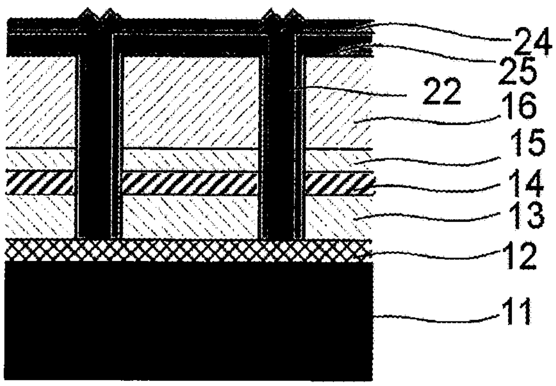

[FIG. 19]
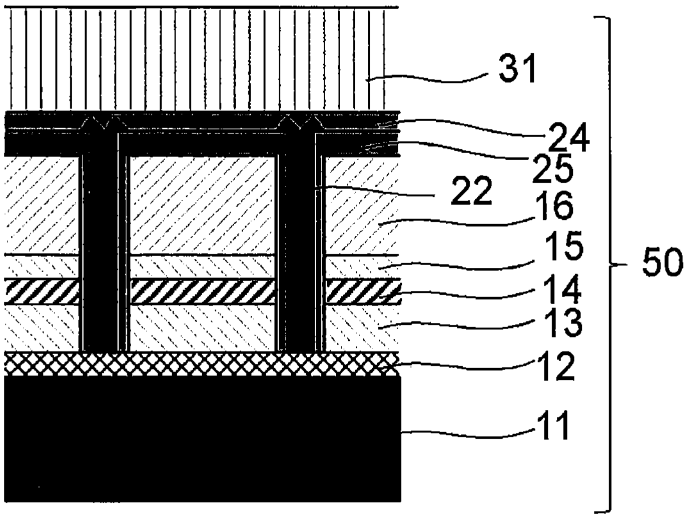
[FIG. 20]
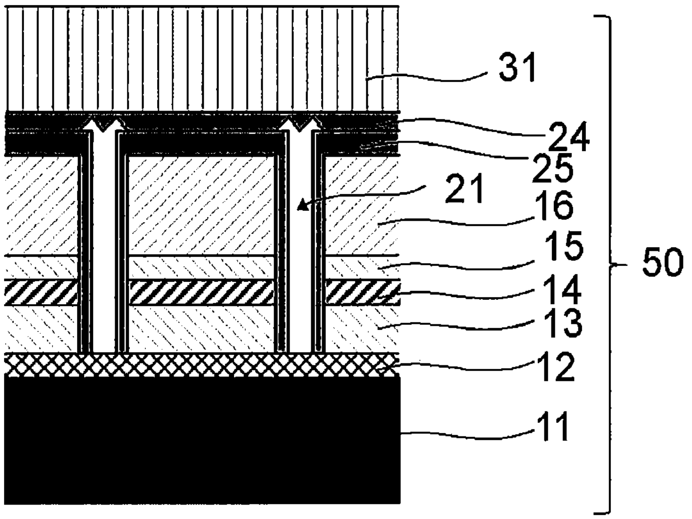
[FIG. 21]
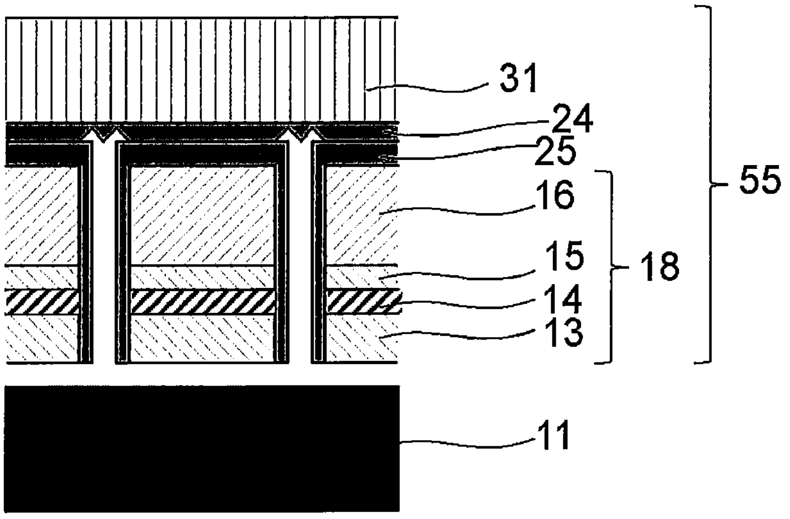

[FIG. 22]
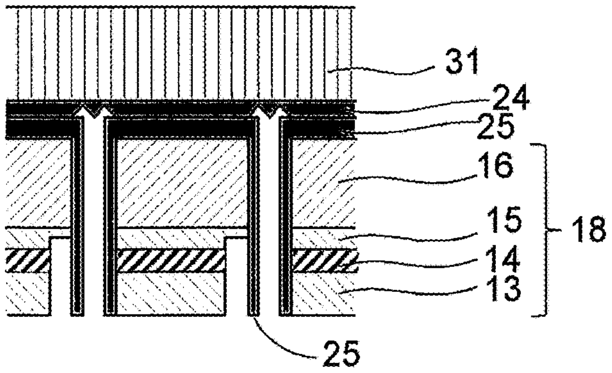
[FIG. 23]
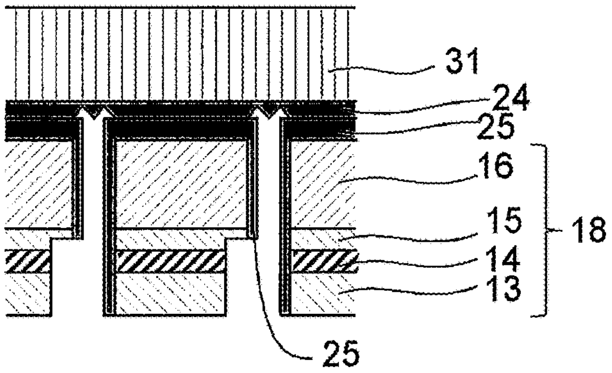
[FIG. 24]
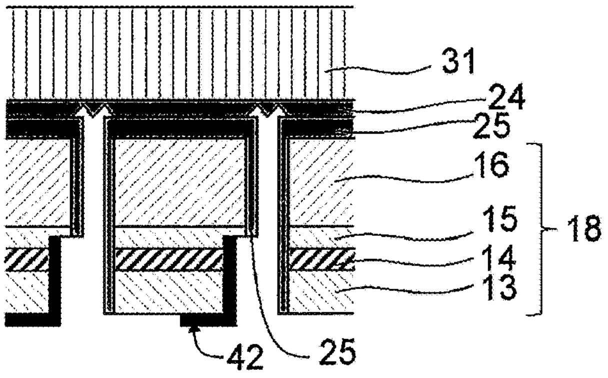
[FIG. 25]
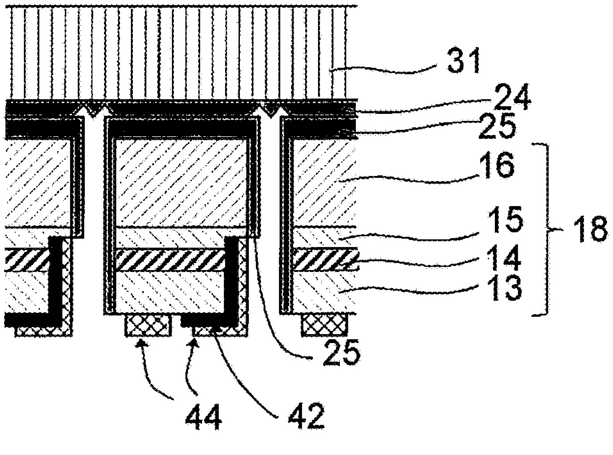

[FIG. 26]
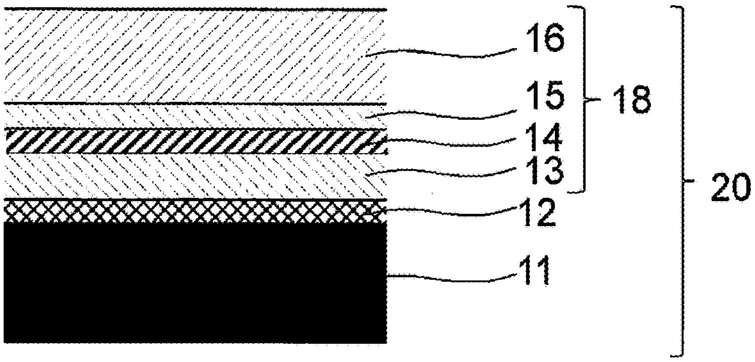
[FIG. 27]
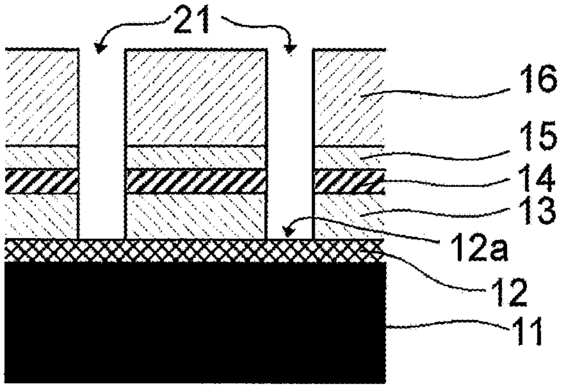
[FIG. 28]
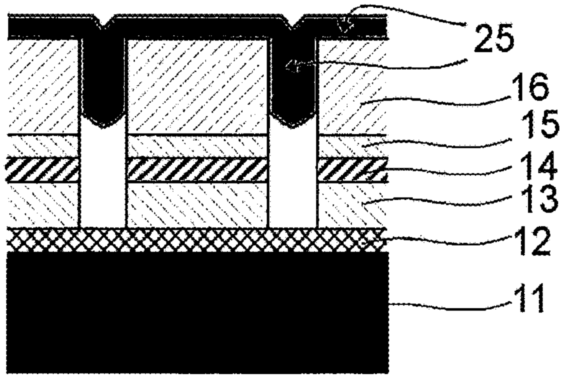
[FIG. 29]
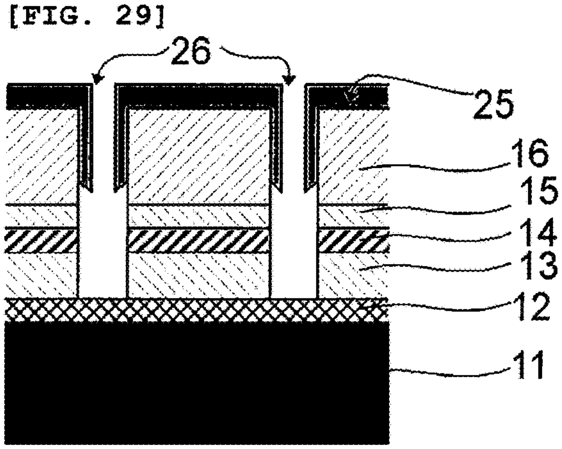

[FIG. 30]
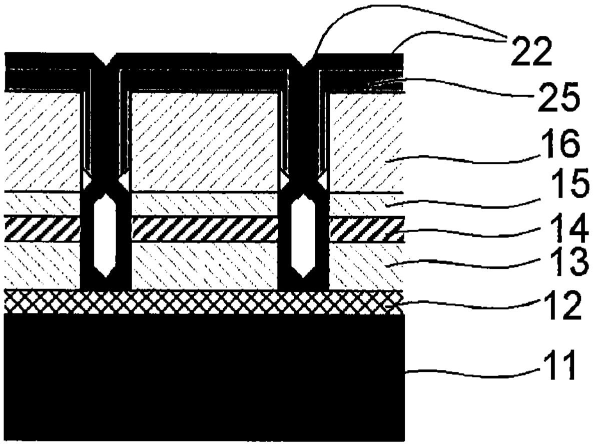
[FIG. 31]
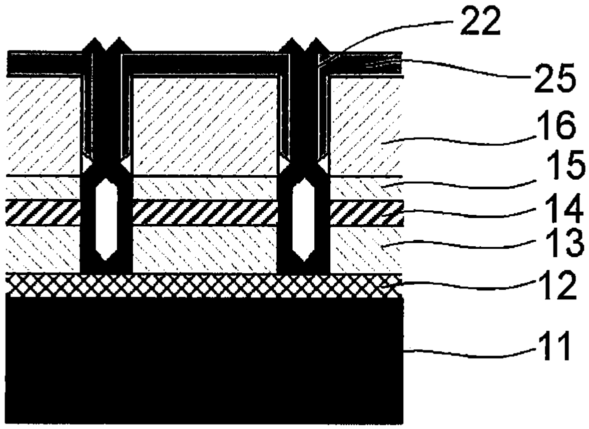
[FIG. 32]
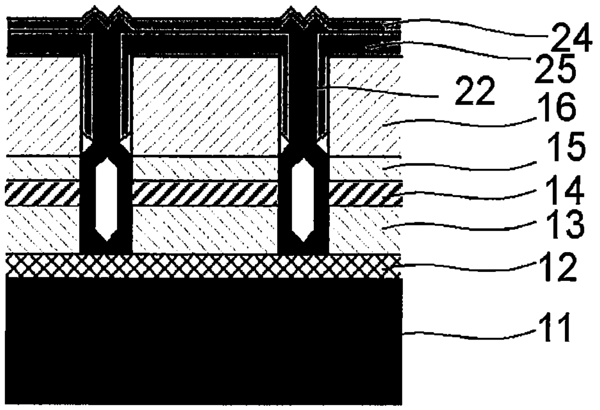

[FIG. 33]
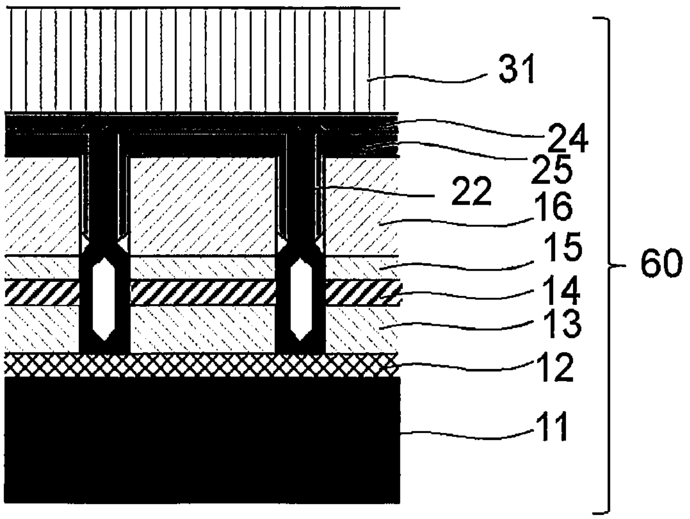
[FIG. 34]
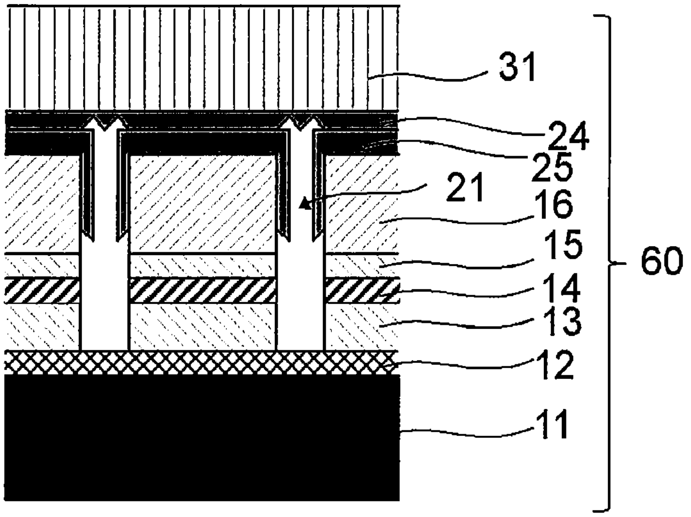
[FIG. 35]
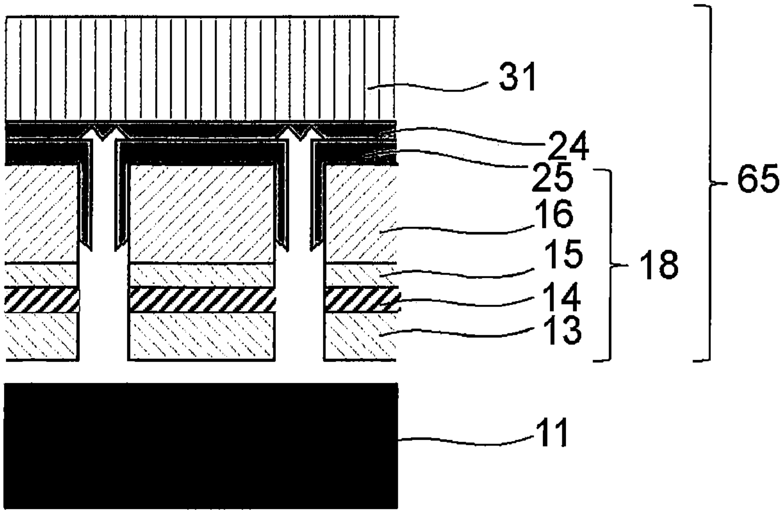

[FIG. 36]
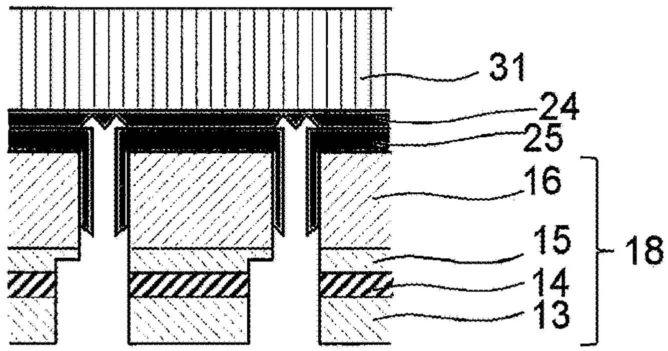
[FIG. 37]
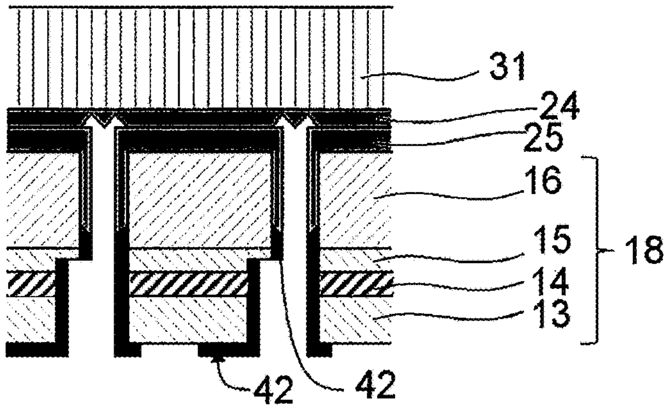
[FIG. 38]
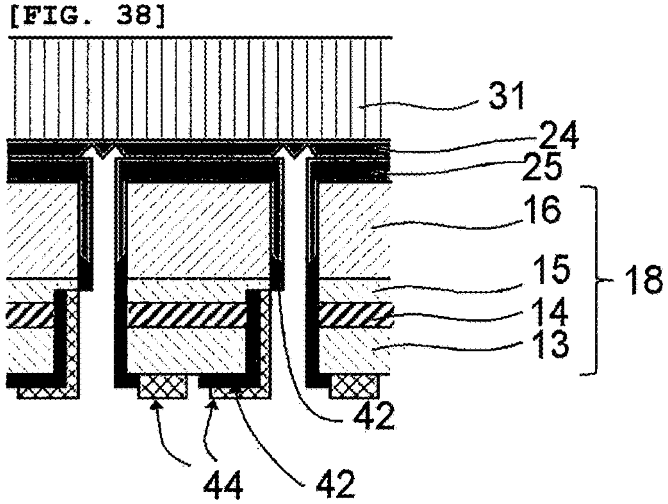
[FIG. 39]
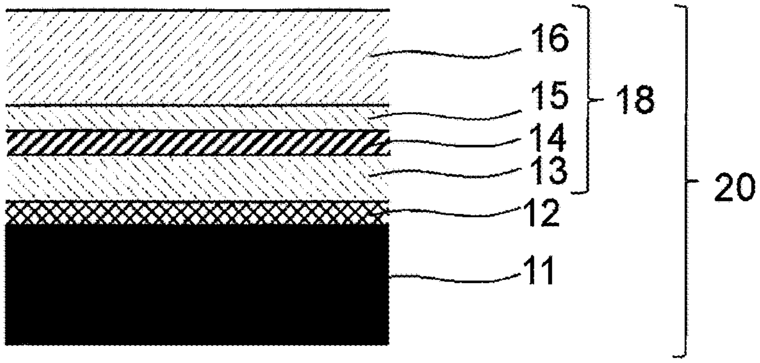

[FIG. 40]
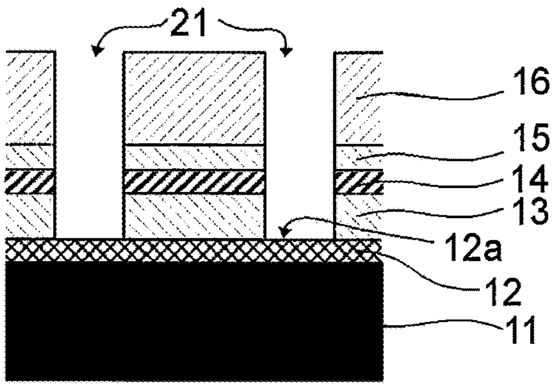
[FIG. 41]
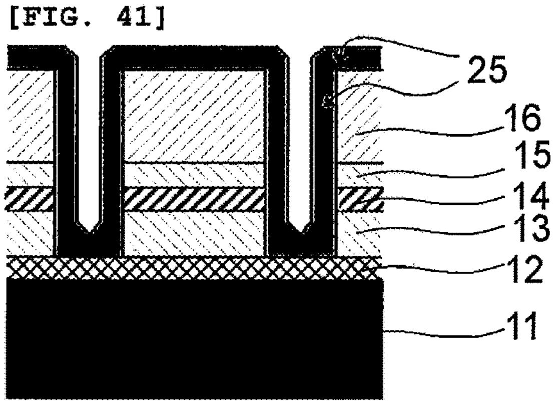
[FIG. 42]
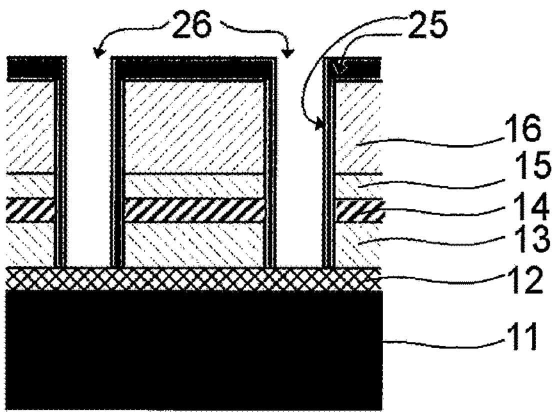
[FIG. 43]
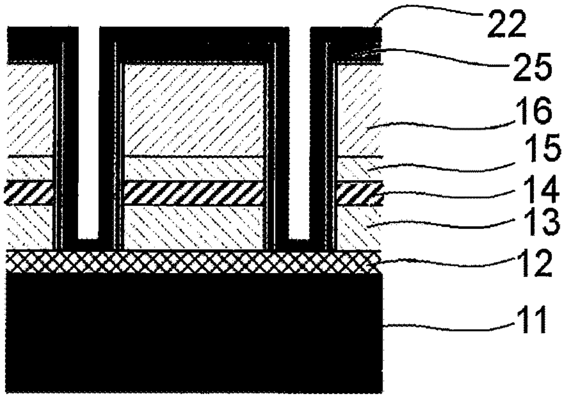

[FIG. 44]
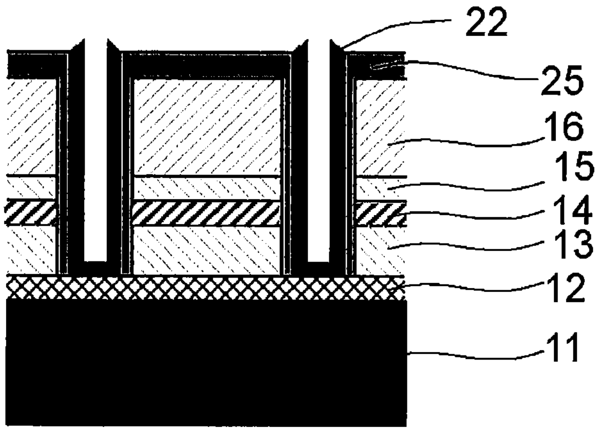
[FIG. 45]
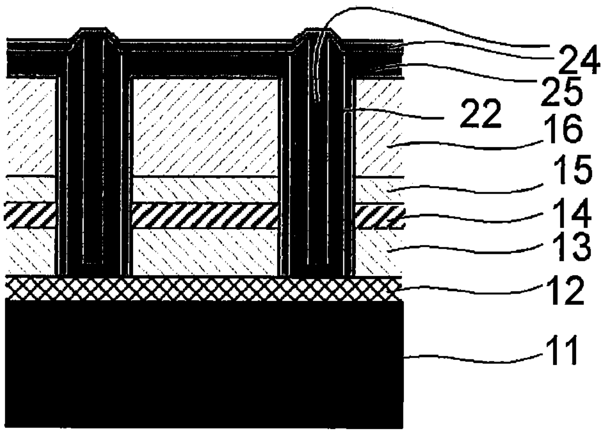
[FIG. 46]
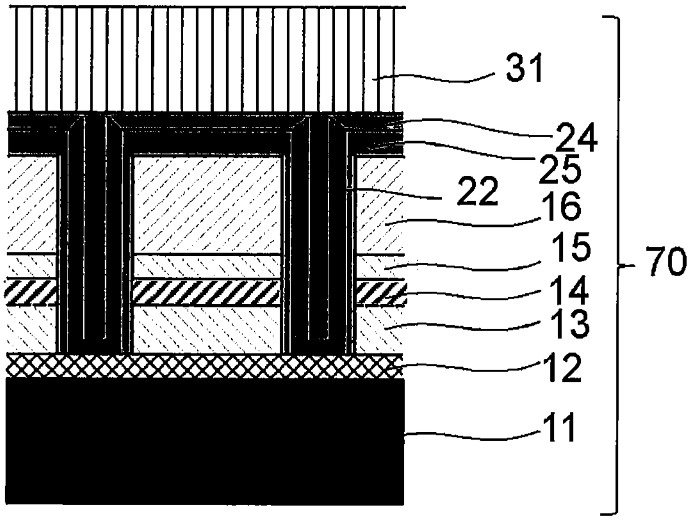

[FIG. 47]
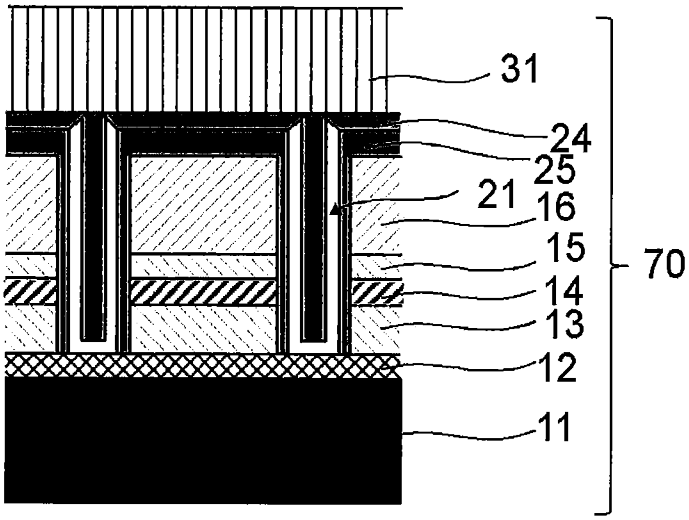
[FIG. 48]
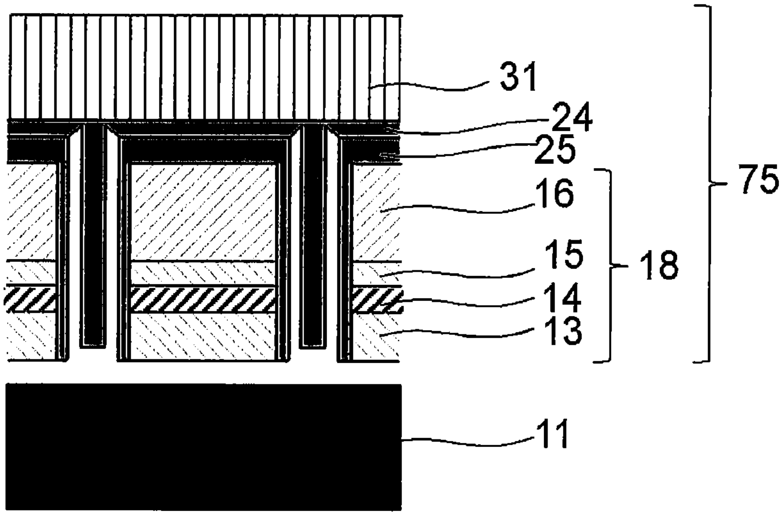
[FIG. 49]
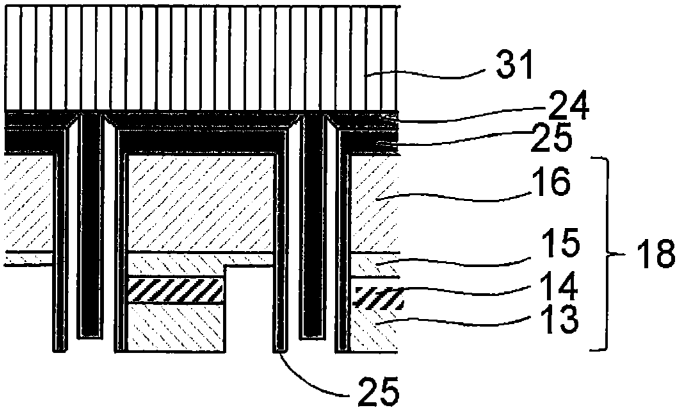

[FIG. 50]
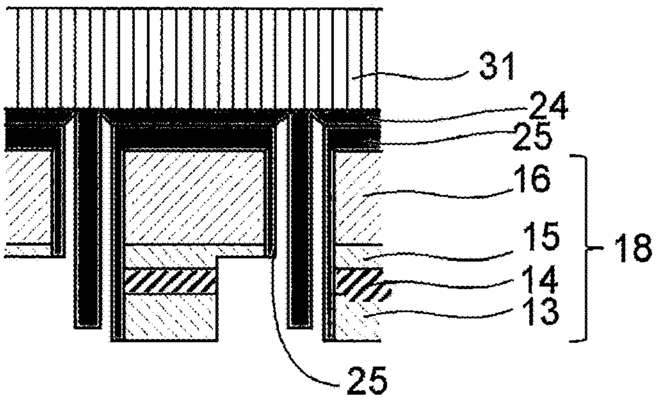
[FIG. 51]
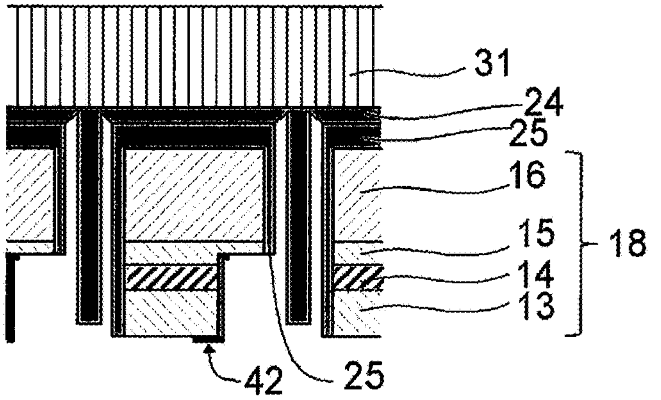
[FIG. 52]
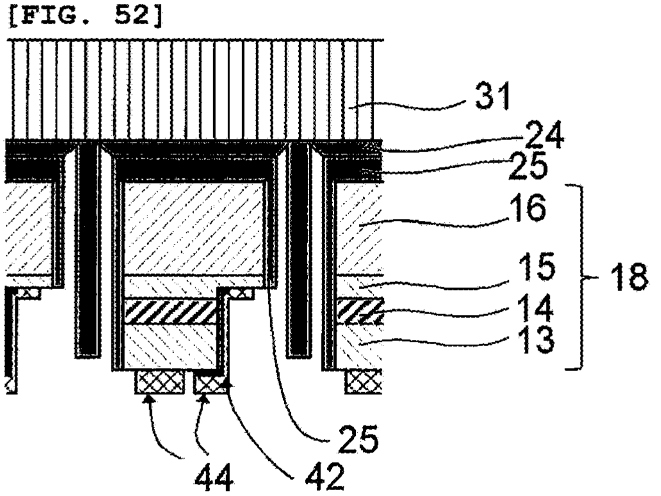
[FIG. 53]
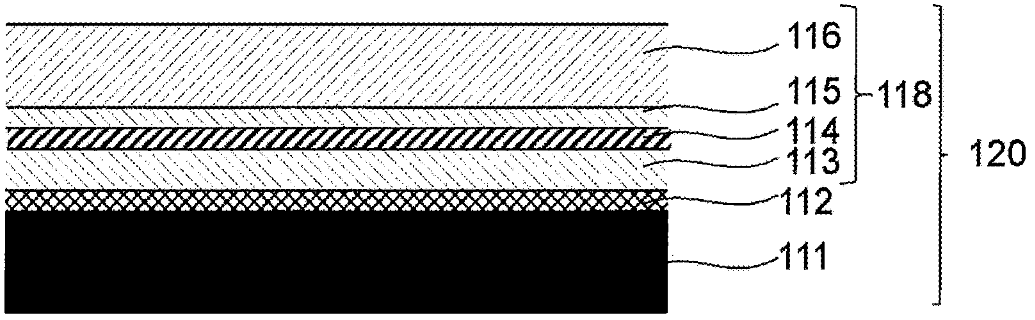

[FIG. 54]
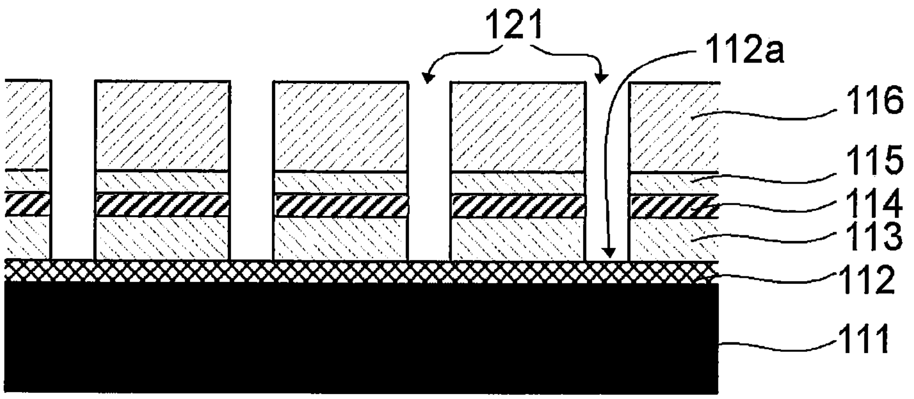
[FIG. 55]
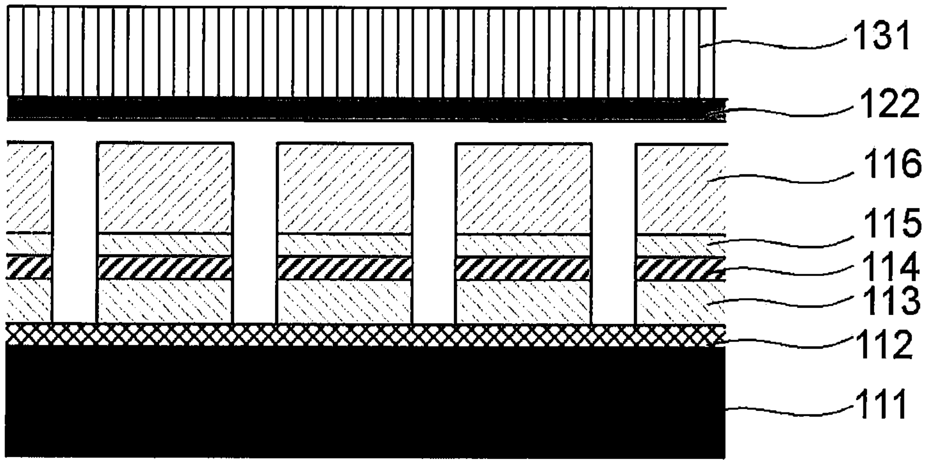
[FIG. 56]
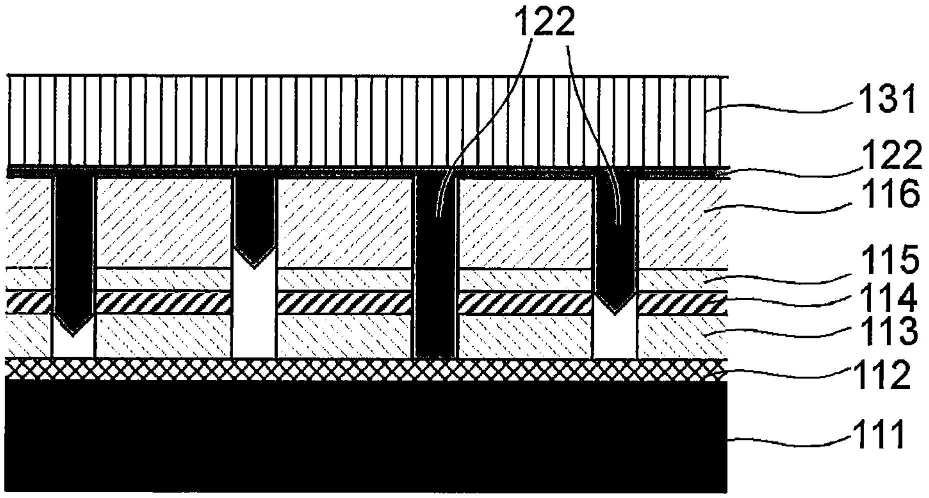

[FIG. 57]
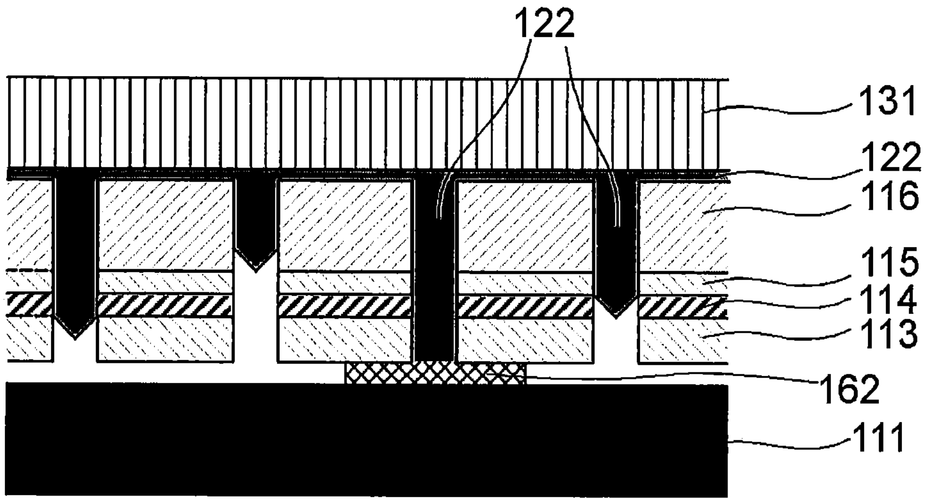
[FIG. 58]
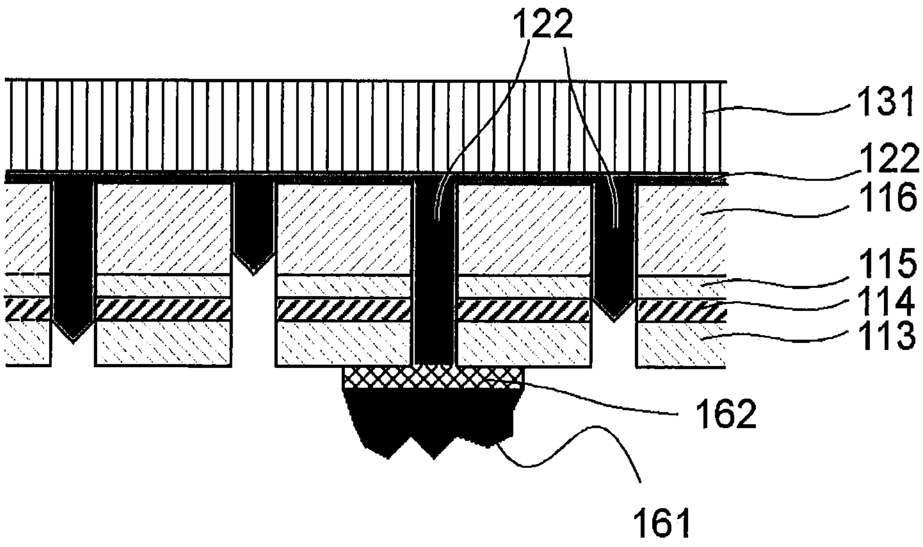
[FIG. 59]
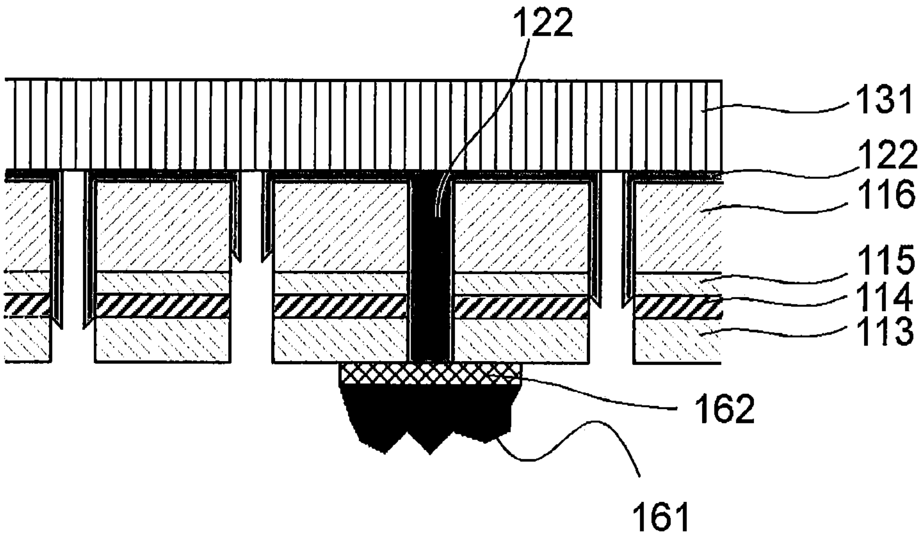

[FIG. 60]
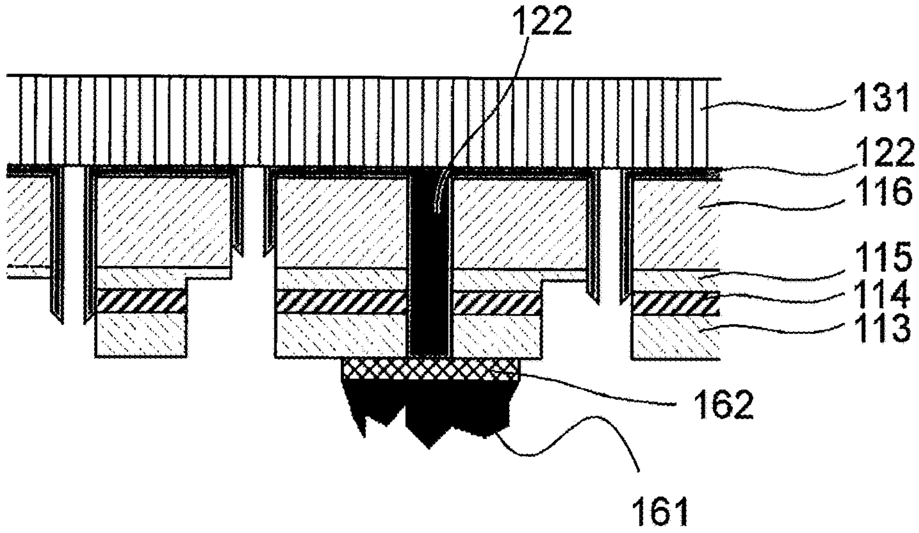
[FIG. 61]
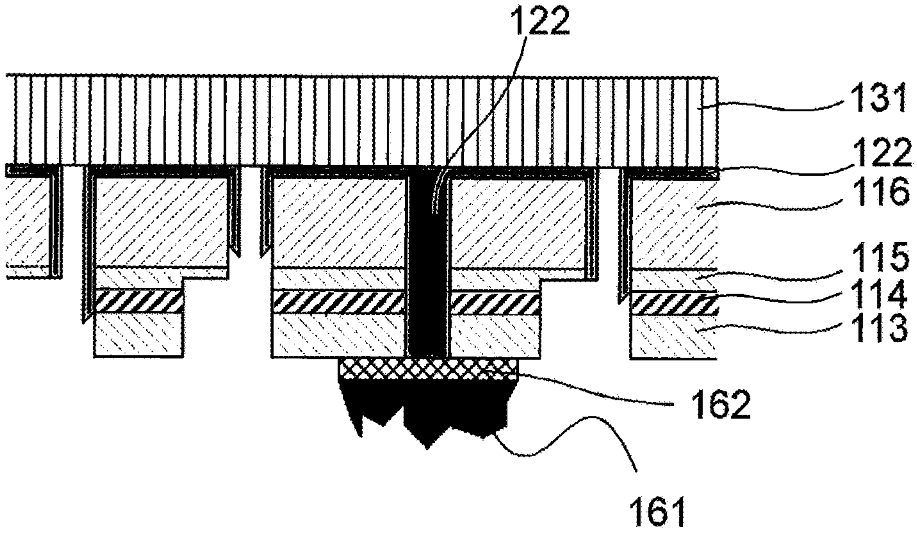
[FIG. 62]
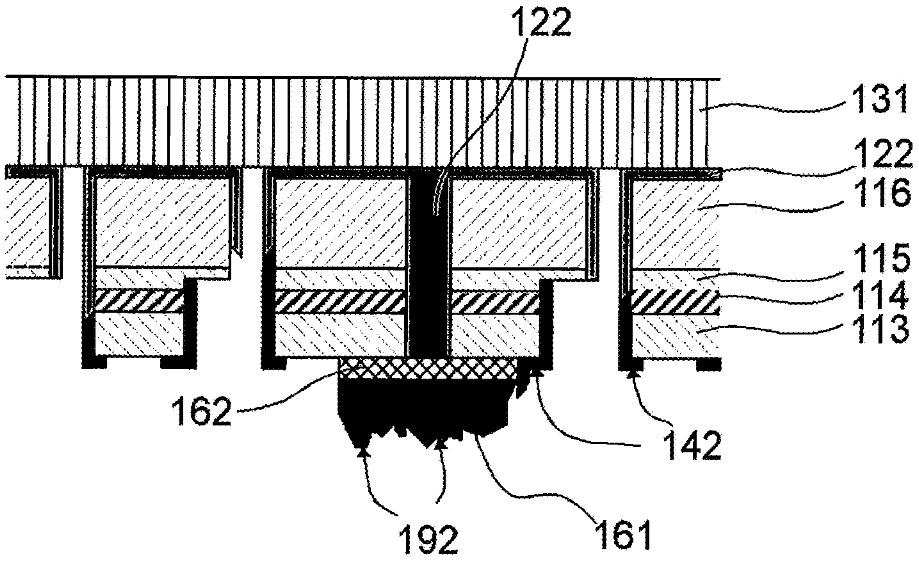

[FIG. 63]
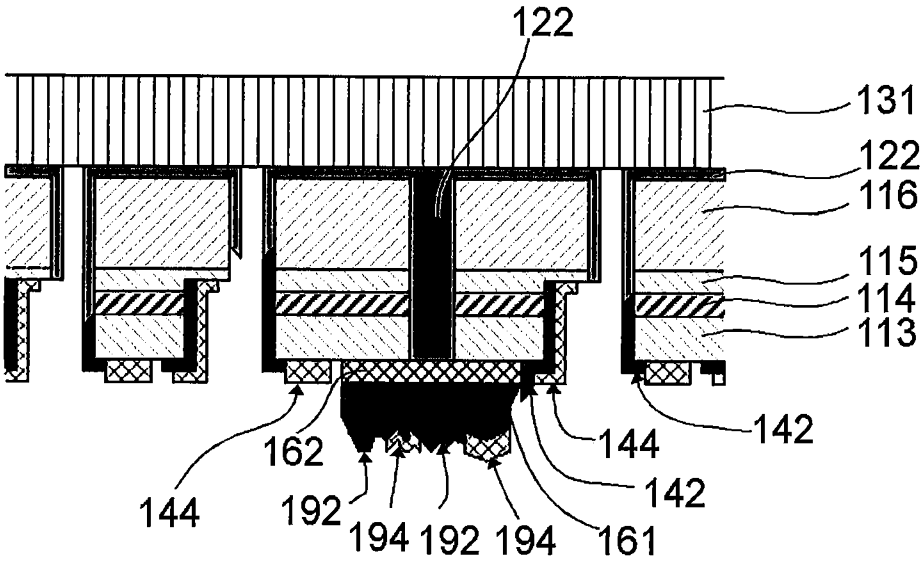
[FIG. 64]
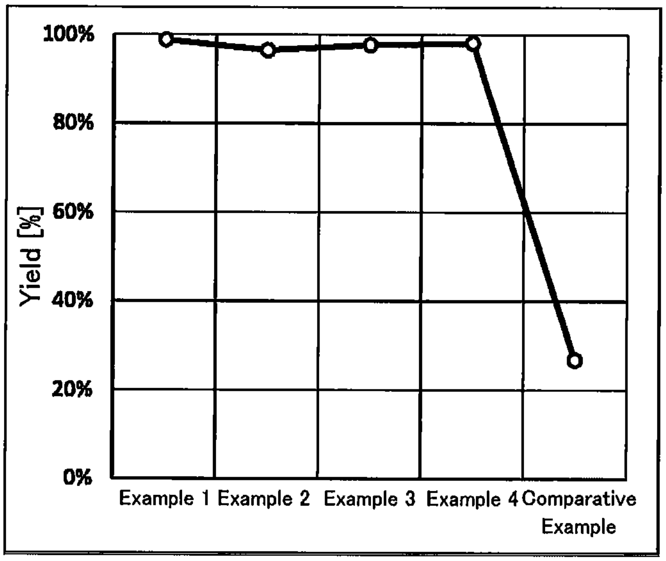

METHOD FOR MANUFACTURING BONDED SEMICONDUCTOR WAFER

TECHNICAL FIELD

The present invention relates to a method for manufacturing a bonded semiconductor wafer.

BACKGROUND ART

An art to separate only a semiconductor functional layer such as epitaxial functional layer from a starting substrate and transferring it to another substrate is an important art for alleviating constraints caused by physical properties of the starting substrate and increasing degree of freedom in designing device systems.

In order to realize this transfer, an art is required to realize the transfer by removing the starting substrate after bonding the epitaxial functional layer to a permanent substrate.

Patent Document 1 discloses an art of bonding a semiconductor epitaxial substrate and a temporary support substrate by thermocompression bonding via a dielectric layer and an art of separating the temporary support substrate and the epitaxial functional layer by wet etching.

Patent Document 2 discloses an art to form a device isolation groove for exposing a sacrificial layer, then performing bonding, and then performing sacrificial layer etching, thereby separating a starting substrate.

However, in this art, a bonding material is required to be a solid material. When a bonding interface is formed by a flexible or liquid material, a bonding layer may deform under pressure during bonding and then seep into the device isolation groove. The seeped bonding material fills the device isolation groove, and as a result, the sacrificial layer, which is the purpose for forming the device isolation groove, is coated with the bonding material; thus, there is a problem in which a sacrificial layer etching does not proceed.

CITATION LIST

Patent Literature

Patent Document 1: JP 2021-27301 A
Patent Document 2: WO 2014/020906 A1

SUMMARY OF INVENTION

Technical Problem

The present invention has been made in view of the above-described problem. An object of the present invention is to provide a method for manufacturing a bonded semiconductor wafer in which sacrificial layer etching is prevented from being inhibited due to seeping of the bonding material to a device isolation groove in the method of manufacturing the bonded semiconductor wafer, in which the device isolation groove is formed in an epitaxial wafer, the wafer is bonded to a to-be-bonded substrate via a flexible bonding material.

Solution to Problem

The present invention has been made to achieve the above object and provide a method for manufacturing a bonded semiconductor wafer, the method including the steps of:

epitaxially growing a sacrificial layer on a starting substrate;

manufacturing an epitaxial wafer by epitaxially growing an epitaxial layer having a semiconductor functional layer on the sacrificial layer;

forming a device isolation groove in a partial region of the epitaxial wafer by a selective etching method so as to expose the sacrificial layer;

forming a passivation film on at least an exposed surface of the sacrificial layer in the device isolation groove;

producing a bonded substrate by bonding the epitaxial layer of the epitaxial wafer to a to-be-bonded substrate being transparent to visible light via a thermosetting bonding material;

removing the passivation film of the bonded substrate by etching; and separating the starting substrate and the epitaxial layer by etching the sacrificial layer by supplying an etchant to the device isolation groove of the bonded substrate.

With such a method for manufacturing the bonded semiconductor wafer, the passivation (PSV) film is formed on at least the surface of the sacrificial layer of the device isolation groove when bonding, thus sacrificial layer etching can be prevented from being inhibited by seeping of the bonding material to a device isolation groove and then by covering the surface of the sacrificial layer.

In this case, the to-be-bonded substrate is preferably made of any one of sapphire, synthetic quartz, quartz (natural quartz), glass, SiC, $LiTaO_3$, and $LiNbO_3$.

Such a to-be-bonded substrate can be selected to have high transparency to laser in particular and is suitable for the to-be-bonded substrate of the inventive method for manufacturing the bonded semiconductor wafer.

In addition, the thermosetting bonding material is preferably made of any one or more kinds of silicone resin, epoxy resin, benzocyclobutene, spin-on-glass, polyimide, and fluororesin.

Such thermosetting bonding materials can be suitably used as the bonding material in the method for manufacturing the bonded semiconductor wafer.

Moreover, a thickness of the thermosetting bonding material is preferably 0.1 μm or more and 0.6 μm or less.

With such an adhesive layer thickness, a thickness variation due to excess thickness does not become a problem, and a sufficient thickness for adhesion can be secured.

In addition, the thermosetting bonding material can be thermally uncured.

In this way, when the thermosetting bonding material is not thermally cured, it can be separated easily when separating.

Moreover, the passivation film is preferably a silicon oxide film.

In this way, when the passivation film used in the present invention is the silicon oxide film, it can be formed and removed relatively easily. Furthermore, removal etching for silicon oxide film can also be combined with sacrificial layer etching by using a fluorine-based solution.

Furthermore, the bonded semiconductor wafer is preferably for a micro-LED.

In this way, the inventive method for manufacturing the bonded semiconductor wafer is particularly advantageous for producing a small-size device such as used for a micro-LED.

Advantageous Effects of Invention

With the inventive method for manufacturing the bonded semiconductor wafer, in the method for manufacturing the bonded semiconductor wafer, in which the epitaxial wafer is formed with the device isolation groove and bonded to the to-be-bonded substrate via a flexible thermosetting bonding material, the presence of the passivation film can prevent inhibiting the sacrificial layer etching by seeping of the bonding material to the device isolation groove. Consequently, a yield of device production can be improved on the bonded semiconductor wafer.

BRIEF DESCRIPTION OF DRAWINGS

FIG. 1 is a schematic cross-sectional view illustrating a part of the first embodiment of a method for manufacturing a bonded semiconductor wafer according to the present invention.

FIG. 2 is a schematic cross-sectional view illustrating another part of the first embodiment of a method for manufacturing a bonded semiconductor wafer according to the present invention.

FIG. 3 is a schematic cross-sectional view illustrating another part of the first embodiment of a method for manufacturing a bonded semiconductor wafer according to the present invention.

FIG. 4 is a schematic cross-sectional view illustrating another part of the first embodiment of a method for manufacturing a bonded semiconductor wafer according to the present invention.

FIG. 5 is a schematic cross-sectional view illustrating another part of the first embodiment of a method for manufacturing a bonded semiconductor wafer according to the present invention.

FIG. 6 is a schematic cross-sectional view illustrating another part of the first embodiment of a method for manufacturing a bonded semiconductor wafer according to the present invention.

FIG. 7 is a schematic cross-sectional view illustrating another part of the first embodiment of a method for manufacturing a bonded semiconductor wafer according to the present invention.

FIG. 8 is a schematic cross-sectional view illustrating another part of the first embodiment of a method for manufacturing a bonded semiconductor wafer according to the present invention.

FIG. 9 is a schematic cross-sectional view illustrating another part of the first embodiment of a method for manufacturing a bonded semiconductor wafer according to the present invention.

FIG. 10 is a schematic cross-sectional view illustrating another part of the first embodiment of a method for manufacturing a bonded semiconductor wafer according to the present invention.

FIG. 11 is a schematic cross-sectional view of an example of a bonded semiconductor wafer obtainable in the first embodiment of a method for manufacturing a bonded semiconductor wafer according to the present invention.

FIG. 12 is a schematic cross-sectional view illustrating a part of the second embodiment of a method for manufacturing a bonded semiconductor wafer according to the present invention.

FIG. 13 is a schematic cross-sectional view illustrating another part of the second embodiment of a method for manufacturing a bonded semiconductor wafer according to the present invention.

FIG. 14 is a schematic cross-sectional view illustrating another part of the second embodiment of a method for manufacturing a bonded semiconductor wafer according to the present invention.

FIG. 15 is a schematic cross-sectional view illustrating another part of the second embodiment of a method for manufacturing a bonded semiconductor wafer according to the present invention.

FIG. 16 is a schematic cross-sectional view illustrating another part of the second embodiment of a method for manufacturing a bonded semiconductor wafer according to the present invention.

FIG. 17 is a schematic cross-sectional view illustrating another part of the second embodiment of a method for manufacturing a bonded semiconductor wafer according to the present invention.

FIG. 18 is a schematic cross-sectional view illustrating another part of the second embodiment of a method for manufacturing a bonded semiconductor wafer according to the present invention.

FIG. 19 is a schematic cross-sectional view illustrating another part of the second embodiment of a method for manufacturing a bonded semiconductor wafer according to the present invention.

FIG. 20 is a schematic cross-sectional view illustrating another part of the second embodiment of a method for manufacturing a bonded semiconductor wafer according to the present invention.

FIG. 21 is a schematic cross-sectional view illustrating another part of the second embodiment of a method for manufacturing a bonded semiconductor wafer according to the present invention.

FIG. 22 is a schematic cross-sectional view illustrating another part of the second embodiment of a method for manufacturing a bonded semiconductor wafer according to the present invention.

FIG. 23 is a schematic cross-sectional view illustrating another part of the second embodiment of a method for manufacturing a bonded semiconductor wafer according to the present invention.

FIG. 24 is a schematic cross-sectional view illustrating another part of the second embodiment of a method for manufacturing a bonded semiconductor wafer according to the present invention.

FIG. 25 is a schematic cross-sectional view of an example of a bonded semiconductor wafer obtainable in the second embodiment of a method for manufacturing a bonded semiconductor wafer according to the present invention.

FIG. 26 is a schematic cross-sectional view illustrating a part of the third embodiment of a method for manufacturing a bonded semiconductor wafer according to the present invention.

FIG. 27 is a schematic cross-sectional view illustrating another part of the third embodiment of a method for manufacturing a bonded semiconductor wafer according to the present invention.

FIG. 28 is a schematic cross-sectional view illustrating another part of the third embodiment of a method for manufacturing a bonded semiconductor wafer according to the present invention.

FIG. 29 is a schematic cross-sectional view illustrating another part of the third embodiment of a method for manufacturing a bonded semiconductor wafer according to the present invention.

FIG. 30 is a schematic cross-sectional view illustrating another part of the third embodiment of a method for manufacturing a bonded semiconductor wafer according to the present invention.

FIG. 31 is a schematic cross-sectional view illustrating another part of the third embodiment of a method for manufacturing a bonded semiconductor wafer according to the present invention.

FIG. 32 is a schematic cross-sectional view illustrating another part of the third embodiment of a method for manufacturing a bonded semiconductor wafer according to the present invention.

FIG. 33 is a schematic cross-sectional view illustrating another part of the third embodiment of a method for manufacturing a bonded semiconductor wafer according to the present invention.

FIG. 34 is a schematic cross-sectional view illustrating another part of the third embodiment of a method for manufacturing a bonded semiconductor wafer according to the present invention.

FIG. 35 is a schematic cross-sectional view illustrating another part of the third embodiment of a method for manufacturing a bonded semiconductor wafer according to the present invention.

FIG. 36 is a schematic cross-sectional view illustrating another part of the third embodiment of a method for manufacturing a bonded semiconductor wafer according to the present invention.

FIG. 37 is a schematic cross-sectional view illustrating another part of the third embodiment of a method for manufacturing a bonded semiconductor wafer according to the present invention.

FIG. 38 is a schematic cross-sectional view of an example of a bonded semiconductor wafer obtainable in the third embodiment of a method for manufacturing a bonded semiconductor wafer according to the present invention.

FIG. 39 is a schematic cross-sectional view illustrating a part of the fourth embodiment of a method for manufacturing a bonded semiconductor wafer according to the present invention.

FIG. 40 is a schematic cross-sectional view illustrating another part of the fourth embodiment of a method for manufacturing a bonded semiconductor wafer according to the present invention.

FIG. 41 is a schematic cross-sectional view illustrating another part of the fourth embodiment of a method for manufacturing a bonded semiconductor wafer according to the present invention.

FIG. 42 is a schematic cross-sectional view illustrating another part of the fourth embodiment of a method for manufacturing a bonded semiconductor wafer according to the present invention.

FIG. 43 is a schematic cross-sectional view illustrating another part of the fourth embodiment of a method for manufacturing a bonded semiconductor wafer according to the present invention.

FIG. 44 is a schematic cross-sectional view illustrating another part of the fourth embodiment of a method for manufacturing a bonded semiconductor wafer according to the present invention.

FIG. 45 is a schematic cross-sectional view illustrating another part of the fourth embodiment of a method for manufacturing a bonded semiconductor wafer according to the present invention.

FIG. 46 is a schematic cross-sectional view illustrating another part of the fourth embodiment of a method for manufacturing a bonded semiconductor wafer according to the present invention.

FIG. 47 is a schematic cross-sectional view illustrating another part of the fourth embodiment of a method for manufacturing a bonded semiconductor wafer according to the present invention.

FIG. 48 is a schematic cross-sectional view illustrating another part of the fourth embodiment of a method for manufacturing a bonded semiconductor wafer according to the present invention.

FIG. 49 is a schematic cross-sectional view illustrating another part of the fourth embodiment of a method for manufacturing a bonded semiconductor wafer according to the present invention.

FIG. 50 is a schematic cross-sectional view illustrating another part of the fourth embodiment of a method for manufacturing a bonded semiconductor wafer according to the present invention.

FIG. 51 is a schematic cross-sectional view illustrating another part of the fourth embodiment of a method for manufacturing a bonded semiconductor wafer according to the present invention.

FIG. 52 is a schematic cross-sectional view of an example of a bonded semiconductor wafer obtainable in the fourth embodiment of a method for manufacturing a bonded semiconductor wafer according to the present invention.

FIG. 53 is a schematic cross-sectional view illustrating a part of a method for manufacturing a bonded semiconductor wafer of Comparative Example.

FIG. 54 is a schematic cross-sectional view illustrating another part of a method for manufacturing a bonded semiconductor wafer of Comparative Example.

FIG. 55 is a schematic cross-sectional view illustrating another part of a method for manufacturing a bonded semiconductor wafer of Comparative Example.

FIG. 56 is a schematic cross-sectional view illustrating another part of a method for manufacturing a bonded semiconductor wafer of Comparative Example.

FIG. 57 is a schematic cross-sectional view illustrating another part of a method for manufacturing a bonded semiconductor wafer of Comparative Example.

FIG. 58 is a schematic cross-sectional view illustrating another part of a method for manufacturing a bonded semiconductor wafer of Comparative Example.

FIG. 59 is a schematic cross-sectional view illustrating another part of a method for manufacturing a bonded semiconductor wafer of Comparative Example.

FIG. 60 is a schematic cross-sectional view illustrating another part of a method for manufacturing a bonded semiconductor wafer of Comparative Example.

FIG. 61 is a schematic cross-sectional view illustrating another part of a method for manufacturing a bonded semiconductor wafer of Comparative Example.

FIG. 62 is a schematic cross-sectional view illustrating another part of a method for manufacturing a bonded semiconductor wafer of Comparative Example.

FIG. 63 is a schematic cross-sectional view of an example of a bonded semiconductor wafer obtained by a method for manufacturing a bonded semiconductor wafer of Comparative Example.

FIG. 64 is a graph illustrating a yield of Examples 1 to 4 and Comparative Example.

DESCRIPTION OF EMBODIMENTS

Hereinafter, the present invention will be described in detail, however, the present invention is not limited thereto.

The present invention is a method for manufacturing a bonded semiconductor wafer, the method including the steps of:

- epitaxially growing a sacrificial layer on a starting substrate;
- manufacturing an epitaxial wafer by epitaxially growing an epitaxial layer having a semiconductor functional layer on the sacrificial layer;
- forming a device isolation groove in a partial region of the epitaxial wafer by a selective etching method so as to expose the sacrificial layer;
- forming a passivation film on at least an exposed surface of the sacrificial layer in the device isolation groove;
- producing a bonded substrate by bonding the epitaxial layer of the epitaxial wafer to a to-be-bonded substrate being transparent to visible light via a thermosetting bonding material;
- removing the passivation film of the bonded substrate by etching; and
- separating the starting substrate and the epitaxial layer by etching the sacrificial layer by supplying an etchant to the device isolation groove of the bonded substrate.

Hereinafter, aspects of the present invention will be described by exemplifying the first to fourth embodiments. Similar components in each embodiment are described with the same reference signs in the drawings. Moreover, overlapping descriptions are partially omitted.

First Embodiment

The first embodiment is described. To begin with, an epitaxial wafer 20 is manufactured by epitaxial growth on a starting substrate 11 sequentially and by a formation of each layer, as shown in FIG. 1. In this way, an epitaxial layer having such as a sacrificial layer 12 and a semiconductor functional layer 18 is produced. More specifically, the epitaxial growth of each layer can be performed as below.

The sacrificial layer 12 is epitaxially grown on the first conductivity type starting substrate made of, for example, GaAs, as shown in FIG. 1. The sacrificial layer 12 can be formed, for example, after laminating a first conductivity type GaAs buffer layer, by growing a first conductivity type GaInP first etching stop layer and then a first conductivity type GaAs second etching stop layer. Moreover, the epitaxial wafer 20 is provided with a light emitting device structure, which is a semiconductor functional layer (epitaxial functional layer) 18, in which a first conductivity type AlGaInP first cladding layer 13, a non-doped AlGaInP active layer 14, a second conductivity type AlGaInP second cladding layer 15, a second conductivity type GaInP intermediate layer (not shown), and a second conductivity type GaP window layer 16 are grown sequentially on the sacrificial layer 12, for example. Here, the portion from the first cladding layer 13 to the second cladding layer 15 is referred to as a double-hetero (DH) structure portion (FIG. 1). Note that materials for the semiconductor functional layer (epitaxial functional layer) 18 are not limited to these. The semiconductor functional layer 18 can be made to have the light emitting device structure as described above, in which case the inventive method for manufacturing the bonded semiconductor wafer can be applied particularly suitable.

Then, as shown in FIG. 2, a device isolation groove 21 is formed in a partial region of the epitaxial wafer 20 so as to expose the sacrificial layer 12 by a selective etching method. More specifically, a device isolation step is performed to form the device isolation groove 21 by forming a mask using a photolithography method and by etching (selective etching) from the Gap window layer 16 to at least the first cladding layer 13 (FIG. 2).

Note that although FIG. 2 shows a state in which the sacrificial layer 12 is exposed (exposed portion 12*a*) and not etched, the state is not limited to this state. For example, the sacrificial layer 12 may be etched across a device separation pattern, and a depth of an etching groove may reach the starting substrate 11. Even in such a state, the sacrificial layer 12 is exposed as a part of a side surface of the device separation pattern. The present invention is also applicable in that case.

Then, as shown in FIG. 3, a passivation film 22 is formed on at least an exposed surface (exposed portion 12*a*) of the sacrificial layer 12 in the device isolation groove 21. More specifically, as shown in FIG. 3, a passivation (PSV) film 22, such as $SiO_2$ (silicon oxide film), can be formed on a surface that configures an outermost surface of the wafer (in the case of FIG. 3, a surface of the window layer 16), and inside the device isolation groove 21 (FIG. 3).

Then, as shown in FIG. 4, a PSV pattern substrate is produced in which the passivation film 22 other than a region inside the device isolation groove 21 is removed (FIG. 4).

By forming the passivation film 22 in the device isolation groove 21 in this way, a sacrificial layer etching can be prevented from being inhibited due to the seeping of the bonding material to the device isolation groove 21 and then blocking the groove by the bonding material, when a to-be-bonded substrate (to-be-bonded wafer) is bonded via the bonding material as described later.

Then, as shown in FIGS. 5 and 6, a bonded substrate 30 is produced by bonding the epitaxial layer having the semiconductor functional layer 18 of the epitaxial wafer 20 to a to-be-bonded substrate 31 being transparent to visible light via a thermosetting bonding material 24. More specifically, first, benzocyclobutene (BCB), for example, is spin-coated as the thermosetting bonding material on the epitaxial wafer as shown in FIG. 5 (FIG. 5). Next, as shown in FIG. 6, such as a sapphire wafer, which is the to-be-bonded substrate 31, is stacked facing each other and bonded by thermocompression, thereby producing the bonded substrate (epitaxial bonded substrate) 30 by bonding the epitaxial wafer 20 and the sapphire wafer 31 via the thermosetting bonding material 24 (BCB) (FIG. 6). When the thermosetting bonding material (BCB) is applied by spin coating, a designed film thickness is preferably 0.01 μm or more and 0.6 μm or less. In addition, the thermosetting bonding material 24 can be thermally uncured. When thermosetting bonding material 24 is not made to be thermally cured, it can be easily separated when separation is performed.

Moreover, the to-be-bonded substrate 31 is not limited to sapphire, and any material can be selected as long as it ensures flatness and has a low absorption rate of an excimer laser light. In addition to sapphire, synthetic quartz, quartz (natural quartz), glass, Sic, $LiTaO_3$, and $LiNbO_3$ can be selected.

Furthermore, the thermosetting bonding material 24 is not limited to BCB, and any material can be selected as long as it has thermosetting properties. In addition to BCB, such as silicone resin, epoxy resin, spin-on-glass (spin-on-glass, SOG), polyimide (Polyimide, PI), fluororesin may be used. Amorphous fluororesin, such as CYTOP (registered trademark), can be used as fluororesin.

Next, as shown in FIG. 7, the passivation film 22 of the bonded substrate 30 is removed by etching. More specifically, for example, the passivation film 22 can be etched using a fluorine-based solution (FIG. 7). In the example of FIG. 7, an etchant is supplied from a nearly vertical direction to the paper surface. The passivation film 22 is removed by this etching, and the device isolation groove 21 comes out.

Then, as shown in FIG. 8, the starting substrate 11 and the epitaxial layer (having semiconductor functional layer 18) are separated by etching the sacrificial layer 12 by supplying the etchant to the device isolation groove 21 of the bonded substrate 30. More specifically, the starting substrate 11 can be separated by etching the sacrificial layer 12 using the fluorine-based solution (FIG. 8). Note that, as shown in FIG. 7 and FIG. 8, the passivation film removal step and the sacrificial layer etching step are described as separate steps, however, both can be performed as virtually a series of steps by selecting materials that are selectively etched using a fluorine-based solution for both the passivation film 22 and the sacrificial layer 12. The material selectively etched as passivation film 22 using the fluorine-based solution is, for example, $SiO_2$, as described above. The material selectively etched as the sacrificial layer 12 using the fluorine-based solution is, for example, GaInP or GaAs, as described above.

In this way, a bonded semiconductor wafer 35 can be manufactured. The bonded semiconductor wafer 35 shown in FIG. 8 can be for micro-LED. In addition, electrodes and the like for each device can be formed subsequently, as follows.

At first, a part of the second cladding layer 15 is exposed by the photolithography method, as shown in FIG. 9 (FIG. 9).

Then, a passivation (PSV) film 42, such as $SiO_2$, is formed on the surface, as shown in FIG. 10, and a PSV pattern film is produced, which is processed to cover an edge portion of the device isolation groove 21 and a side surface of the exposed active layer 14, and to expose a part of the first cladding layer 13 and the second cladding layer 15 (FIG. 10).

Then, electrodes 44 are formed on the exposed portion of the passivation film 42, as shown in FIG. 11, and an ohmic contact is realized by performing heat treatment (FIG. 11).

Second Embodiment

Then, the second embodiment of the present invention is described. To begin with, as similar in the first embodiment, epitaxial growth is performed sequentially on a starting substrate 11, and each layer is formed, and then an epitaxial wafer 20 is manufactured with an epitaxial layer having a sacrificial layer 12 and a semiconductor functional layer 18. More specifically, epitaxial growth of each layer can be performed as follows.

First, the sacrificial layer 12 is epitaxially grown on the first conductivity type starting substrate 11 made of, for example, GaAs, as shown in FIG. 12. The sacrificial layer 12 can be formed, for example, after laminating a first conductivity type GaAs buffer layer, then by growing a first conductivity type GaInP first etching stop layer, and then a first conductivity type GaAs second etching stop layer. Moreover, the epitaxial wafer 20 is provided with a light emitting device structure, which is a semiconductor functional layer (epitaxial functional layer) 18, in which a first conductivity type AlGaInP first cladding layer 13, a non-doped AlGaInP active layer 14, a second conductivity type AlGaInP second cladding layer 15, a second conductivity type GaInP intermediate layer (not shown), and a second conductivity type GaP window layer 16 are grown sequentially on the sacrificial layer 12, for example. Here, the portion from the first cladding layer 13 to the second cladding layer 15 is referred to as a double-hetero (DH) structure portion (FIG. 12). Note that materials for the semiconductor functional layer (epitaxial functional layer) 18 are not limited to these. The semiconductor functional layer 18 can be made to have the light emitting device structure as described above.

Then, as shown in FIG. 13, a device isolation groove 21 is formed in a partial region of the epitaxial wafer 20 so as to expose the sacrificial layer 12 by a selective etching method. more specifically, a device isolation step is performed to form the device isolation groove 21 by forming a mask using a photolithography method and by etching (selective etching) from the Gap window layer 16 to at least the first cladding layer 13 (FIG. 13). This result in that the sacrificial layer 12 is exposed (exposed portion 12*a*).

Then, such as benzocyclobutene (BCB) as a thermosetting bonding material is spin-coated on the epitaxial wafer 20 (FIG. 14), as shown in FIG. 14, and then heat is applied at 250° C. for 1 hour to cure the BCB film (the cured thermosetting bonding material is shown as a curable bonding material 25 in the drawing).

Then, as shown in FIG. 15, a photolithography method is used to remove the curable bonding material (cured BCB portion) 25 of a part of the device isolation groove 21 to form an opening 26 and expose an exposed portion 12*a* of the sacrificial layer 12 (FIG. 15).

Then, as shown in FIG. 16, a passivation (PSV) film 22, such as $SiO_2$, is formed on the surface (FIG. 16), and as shown in FIG. 17, a PSV pattern substrate is produced, in which the passivation film 22 is removed from the region other than the device isolation groove 21 (FIG. 17).

Then, as shown in FIG. 18, benzocyclobutene (BCB) is spin-coated as a thermosetting bonding material 24 on the epitaxial wafer (FIG. 18).

Next, as shown in FIG. 19, such as a sapphire wafer, which is the to-be-bonded substrate 31, is stacked facing each other and bonded by thermocompression, thereby producing the bonded substrate (epitaxial bonded substrate) 50 by bonding the epitaxial wafer 20 and the sapphire wafer 31 via the thermosetting bonding material 24 (BCB) (FIG. 19). When the thermosetting bonding material (BCB) is applied by spin coating, a designed film thickness is preferably 0.01 μm or more and 0.6 μm or less.

Moreover, the to-be-bonded substrate 31 is not limited to sapphire, and any material can be selected as long as it ensures flatness and has a low absorption rate of an excimer laser light. In addition to sapphire, synthetic quartz, quartz (natural quartz), glass, SiC, $LiTaO_3$, and $LiNbO_3$ can be selected.

Furthermore, the thermosetting bonding material 24 is not limited to BCB, and any material can be selected as long as it has thermosetting properties. In addition to BCB, such as silicone resin, epoxy resin, spin-on-glass (spin-on-glass, SOG), polyimide (Polyimide, PI), fluororesin may be used.

Then, as shown in FIG. 20, the passivation film 22 of the bonded substrate 50 is removed by etching. More specifically, for example, the passivation film 22 can be etched using a fluorine-based solution (FIG. 20). In the example of FIG. 20, an etchant is supplied from a nearly vertical direction to the paper surface. The passivation film 22 is removed by this etching, and the device isolation groove 21 comes out.

Then, as shown in FIG. 21, the starting substrate 11 and the epitaxial layer (having semiconductor functional layer 18) are separated by etching the sacrificial layer 12 by supplying the etchant to the device isolation groove 21 of the bonded substrate 50. More specifically, as shown in FIG. 21, the starting substrate 11 is separated by etching the sacrificial layer 12 using the fluorine-based solution (FIG. 21). Note that, as shown in FIG. 21 and FIG. 22, the passivation film removal step and the sacrificial layer etching step are described as separate steps, however, both can be performed as virtually a series of steps by selecting materials that are selectively etched using a fluorine-based solution for both the passivation film 22 and the sacrificial layer 12.

In this way, a bonded semiconductor wafer 55 can be manufactured. The bonded semiconductor wafer 55 shown in FIG. 21 can be for micro-LED. In addition, electrodes and the like for each device can be formed subsequently, as follows.

To begin with, as shown in FIG. 22, a part of the second cladding layer 15 is exposed by the photolithography method (FIG. 22). Then, the curable bonding material 25 (BCB cured portion) in the spike shape, as shown in FIG. 23, is physically removed by such as a lift-off method (FIG. 23). Here, the curable bonding material 25 (BCB cured portion) in the spike shape can be removed by the liquid flow at a pressure of about 5 kgf/cm$^2$, however, the method is not limited to this method, and an ashing method or RIE (reactive ion etching) method may be used. Although the curable bonding material 25 (BCB cured film) is isotropically affected in the ashing method and the RIE method, it is possible to remove only the spike-shaped BCB cured portions when the time condition is right because an encroachment rate of the spike-shaped BCB cured portion is faster than that of the film-shaped BCB cured portion.

Then, a passivation (PSV) film 42, such as $SiO_2$, is formed on the surface as shown in FIG. 24, and a PSV pattern film is produced, which is processed to cover a side surface of the exposed active layer 14 and to expose a part of the first cladding layer 13 and the second cladding layer 15 (FIG. 24).

Then, electrodes 44 are formed on the exposed portion of the passivation film 42, as shown in FIG. 25, and an ohmic contact is realized by performing heat treatment (FIG. 25).

Third Embodiment

Then, the third embodiment of the present invention is described. To begin with, as similar in the first and second embodiments, epitaxial growth is performed sequentially on a starting substrate 11, and each layer is formed, and then an epitaxial wafer 20 is manufactured with an epitaxial layer having a sacrificial layer 12 and a semiconductor functional layer 18. More specifically, epitaxial growth of each layer can be performed as follows.

First, the sacrificial layer 12 is epitaxially grown on the first conductivity type starting substrate 11 made of, for example, GaAs, as shown in FIG. 26. The sacrificial layer 12 can be formed, for example, after laminating a first conductivity type GaAs buffer layer, then by growing a first conductivity type GaInP first etching stop layer, and then a first conductivity type GaAs second etching stop layer. Moreover, the epitaxial wafer 20 is provided with a light emitting device structure, which is a semiconductor functional layer (epitaxial functional layer) 18, in which a first conductivity type AlGaInP first cladding layer 13, a non-doped AlGaInP active layer 14, a second conductivity type AlGaInP second cladding layer 15, a second conductivity type GaInP intermediate layer (not shown), and a second conductivity type GaP window layer 16 are grown sequentially on the sacrificial layer 12, for example. Here, the portion from the first cladding layer 13 to the second cladding layer 15 is referred to as a double-hetero (DH) structure portion (FIG. 26). Note that materials for the semiconductor functional layer (epitaxial functional layer) 18 are not limited to these. The semiconductor functional layer 18 can be made to have the light emitting device structure as described above.

Then, as shown in FIG. 27, a device isolation groove 21 is formed in a partial region of the epitaxial wafer 20 so as to expose the sacrificial layer 12 by a selective etching method. More specifically, a device isolation step is performed to form the device isolation groove 21 by forming a mask using a photolithography method and by etching (selective etching) from the Gap window layer 16 to at least the first cladding layer 13 (FIG. 27). This exposes the sacrificial layer 12 (exposed portion 12*a*).

Then, as shown in FIG. 28, such as benzocyclobutene (BCB), as a thermosetting bonding member, is spin-coated on the epitaxial wafer 20 (FIG. 28), and then heat is applied at 250° C. for 1 hour to cure the BCB film (the cured thermosetting bonding material is shown as a curable bonding material 25 in the drawing). In addition, as a general trend, when an aspect ratio such as the width and depth of the device isolation groove 21 is larger (deeper) than 0.1, the BCB does not reach the bottom of the device isolation groove, and a part of the DH structure portion, and the sacrificial layer 12 are in an exposed state at the bottom of the device isolation groove 21.

Then, as shown in FIG. 29, a photolithography method is used to remove the curable bonding material 25 (cured BCB portion) of a part of the device isolation groove 21 to form an opening 26 and expose the sacrificial layer 12 (FIG. 29).

Then, as shown in FIG. 30, a passivation (PSV) film 22, such as $SiO_2$, is formed on the surface (FIG. 30), and then, as shown in FIG. 31, a PSV pattern substrate is produced, in which the passivation film 22 is removed from the region other than the device isolation groove 21 (FIG. 31).

Then, as shown in FIG. 32, a thermosetting bonding material 24, such as benzocyclobutene (BCB), is spin-coated on the epitaxial wafer 20 (FIG. 32), then as shown in FIG. 33, such as a sapphire wafer which is the to-be-bonded substrate 31 is stacked facing each other and bonded by thermocompression, thereby producing the bonded substrate (epitaxial bonded substrate) 60 by bonding the epitaxial wafer 20 and the sapphire wafer 31 via the thermosetting bonding material (BCB). When the thermosetting bonding material (BCB) is applied by spin coating, a designed film thickness is preferably 0.1 μm or more and 0.6 μm or less (FIG. 33).

Moreover, the to-be-bonded substrate 31 is not limited to sapphire, and any material can be selected as long as it ensures flatness and has a low absorption rate of an excimer laser light. In addition to sapphire, synthetic quartz, quartz (natural quartz), glass, Sic, $LiTaO_3$, and $LiNbO_3$ can be selected.

Furthermore, the thermosetting bonding material 24 is not limited to BCB, and any material can be selected as long as it has thermosetting properties. In addition to BCB, such as silicone resin, epoxy resin, spin-on-glass (spin-on-glass, SOG), polyimide (Polyimide, PI), fluororesin may be used.

Then, as shown in FIG. 34, the passivation film 22 of the bonded substrate 60 is removed by etching. More specifically, for example, the passivation film 22 can be etched using a fluorine-based solution (FIG. 34). In the example of FIG. 34, an etchant is supplied from a nearly vertical direction to the paper surface. The passivation film 22 is removed by this etching, and the device isolation groove 21 comes out.

Then, as shown in FIG. 35, the starting substrate 11 and the epitaxial layer (having semiconductor functional layer 18) are separated by etching the sacrificial layer 12 by supplying the etchant to the device isolation groove 21 of the bonded substrate 60. More specifically, as shown in FIG. 35, the starting substrate 11 is separated by etching the sacrificial layer 12 using the fluorine-based solution (FIG. 35). Note that, as shown in FIG. 34 and FIG. 35, the passivation film removal step and the sacrificial layer etching step are described as separate steps, however, both can be performed as virtually a series of steps by selecting materials that are Selectively etched using a fluorine-based solution for both the passivation film 22 and the sacrificial layer 12.

In this way, a bonded semiconductor wafer 65 can be manufactured. The bonded semiconductor wafer 65 shown in FIG. 35 can be for micro-LED. In addition, electrodes and the like for each device can be formed subsequently, as follows.

To begin with, as shown in FIG. 36, a part of the second cladding layer 15 is exposed by the photolithography method (FIG. 36).

Then, a passivation (PSV) film 42, such as $SiO_2$, is formed on the surface, as shown in FIG. 37, and a PSV pattern film is produced, which is processed to cover an edge portion of the device isolation groove 21 and a side surface of the exposed active layer 14, and to expose a part of the first cladding layer 13 and the second cladding layer 15 (FIG. 37).

Then, electrodes 44 are formed on the exposed portion of the passivation film 42, as shown in FIG. 38, and an ohmic contact is realized by performing heat treatment (FIG. 38).

Fourth Embodiment

Then, the fourth embodiment of the present invention is described. To begin with, as similar in the first to third embodiments, epitaxial growth is performed sequentially on a starting substrate 11, and each layer is formed, and then an epitaxial wafer 20 is manufactured with an epitaxial layer having a sacrificial layer 12 and a semiconductor functional layer 18. More specifically, epitaxial growth of each layer can be performed as follows.

First, the sacrificial layer 12 is epitaxially grown on the first conductivity type starting substrate 11 made of, for example, GaAs, as shown in FIG. 39. The sacrificial layer 12 can be formed, for example, after laminating a first conductivity type GaAs buffer layer, then by growing a first conductivity type GaInP first etching stop layer, and then a first conductivity type GaAs second etching stop layer. Moreover, the epitaxial wafer 20 is provided with a light emitting device structure which is a semiconductor functional layer (epitaxial functional layer) 18, in which a first conductivity type AlGaInP first cladding layer 13, a non-doped AlGaInP active layer 14, a second conductivity type AlGaInP second cladding layer 15, a second conductivity type GaInP intermediate layer (not shown), and a second conductivity type Gap window layer 16 are grown sequentially on the sacrificial layer 12 for example. Here, the portion from the first cladding layer 13 to the second cladding layer 15 is referred to as a double-hetero (DH) structure portion (FIG. 39). Note that materials for the semiconductor functional layer (epitaxial functional layer) 18 are not limited to these. The semiconductor functional layer 18 can be made to have the light emitting device structure as described above.

Then, as shown in FIG. 40, a device isolation groove 21 is formed in a partial region of the epitaxial wafer 20 so as to expose the sacrificial layer 12 by a selective etching method. More specifically, a device isolation step is performed to form the device isolation groove 21 by forming a mask using a photolithography method and by etching (selective etching) from the Gap window layer 16 to at least the first cladding layer 13 (FIG. 40). This results in that the sacrificial layer 12 is exposed (exposed portion 12*a*).

Then, benzocyclobutene (BCB), as a thermosetting bonding material, is spin-coated on the epitaxial wafer 20 (FIG. 41), as shown in FIG. 41, and then heat is applied at 250° C. for 1 hour to cure the BCB film (the cured thermosetting bonding material is shown as a curable bonding material 25 in the drawing).

As a general trend, when an aspect ratio such as the width and depth of the device isolation groove 21 is larger (deeper) than 0.1, the BCB is in a state where the device isolation groove is not completely filled.

Then, as shown in FIG. 42, a photolithography method is used to remove the curable bonding material 25 (cured BCB portion) of a part of the device isolation groove 21 to form an opening 26 and expose the sacrificial layer 12 (FIG. 42).

Then, as shown in FIG. 43, a passivation (PSV) film 22, such as $SiO_2$, is formed on the surface (FIG. 43), and as shown in FIG. 44, a PSV pattern substrate is produced, in which the passivation film is removed from the region other than the device isolation groove 21 (FIG. 44).

Then, as shown in FIG. 45, a thermosetting bonding material 24, such as benzocyclobutene (BCB), is spin-coated on the epitaxial wafer 20 (FIG. 45), and as shown in FIG. 46, such as a sapphire wafer, which is the to-be-bonded substrate 31, is stacked facing each other and bonded by thermocompression, thereby producing the bonded substrate (epitaxial bonded substrate) 70 by bonding the epitaxial wafer 20 and the sapphire wafer 31 via the thermosetting bonding material (BCB). When the thermosetting bonding material (BCB) is applied by spin coating, a designed film thickness is preferably 0.1 μm or more and 0.6 μm or less (FIG. 46).

Moreover, the to-be-bonded substrate 31 is not limited to sapphire, and any material can be selected as long as it ensures flatness and has a low absorption rate of an excimer laser light. In addition to sapphire, synthetic quartz, quartz (natural quartz), glass, Sic, $LiTaO_3$, and $LiNbO_3$ can be selected.

Furthermore, the thermosetting bonding material 24 is not limited to BCB, and any material can be selected as long as it has thermosetting properties. In addition to BCB, such as silicone resin, epoxy resin, spin-on-glass (spin-on-glass, SOG), polyimide (Polyimide, PI), fluororesin may be used.

Then, as shown in FIG. 47, the passivation film 22 of the bonded substrate 70 is removed by etching. More specifically, for example, the passivation film 22 can be etched using a fluorine-based solution (FIG. 47). In the example of FIG. 47, an etchant is supplied from a nearly vertical direction to the paper surface. The passivation film 22 is removed by this etching, and the device isolation groove 21 comes out.

Then, as shown in FIG. 48, the starting substrate 11 and the epitaxial layer (having semiconductor functional layer 18) are separated by etching the sacrificial layer 12 by supplying the etchant to the device isolation groove 21 of the bonded substrate 70. More specifically, as shown in FIG. 48, the starting substrate 11 is separated by etching the sacrificial layer 12 using the fluorine-based solution (FIG. 48). Note that, as shown in FIG. 47 and FIG. 48, the passivation film removal step and the sacrificial layer etching step are described as separate steps, however, both can be performed as virtually a series of steps by selecting materials that are Selectively etched using a fluorine-based solution for both the passivation film 22 and the sacrificial layer 12.

In this way, a bonded semiconductor wafer 75 can be manufactured. The bonded semiconductor wafer 75 shown in FIG. 48 can be for micro-LED. In addition, electrodes and the like for each device can be formed subsequently, as follows.

To begin with, as shown in FIG. 49, a part of the second cladding layer 15 is exposed by the photolithography method (FIG. 49).

Next, as shown in FIG. 50, the curable bonding material 25 (BCB cured portion) in the spike shape is physically removed by such as lift-off method (FIG. 50). In this embodiment, the BCB cured portion in the spike shape can be removed by the liquid flow at a pressure of about 5 kgf/cm$^2$, however needless to say, the method is not limited to this method. An ashing method may be used, and an RIE method may also be used. Although the curable bonding material 25 (BCB cured film) is isotropically affected in the ashing method and the RIE method, it is possible to remove only the spike-shaped BCB cured portions when the time condition is right because an encroachment rate of the spike-shaped BCB cured portion is faster than that of the film-shaped BCB cured portion.

Then, a passivation (PSV) film 42, such as $SiO_2$, is formed on the surface, as shown in FIG. 51, covering a side surface of the exposed active layer 14 and producing a PSV pattern film processed to expose a part of the first cladding layer 13 and the second cladding layer 15 (FIG. 51).

Then, electrodes 44 are formed on the exposed portion of the passivation film 42, as shown in FIG. 52, and an ohmic contact is realized by performing heat treatment (FIG. 52).

EXAMPLE

Hereinafter, the present invention will be described in detail with reference to Examples and Comparative Example. However, the present invention is not limited thereto.

Example 1

To begin with, as shown in FIG. 1, after laminating a first conductivity type GaAs buffer layer on a first conductivity type GaAs starting substrate 11, a first conductivity type $Ga_xIn_{1-x}P$ ($0.4 \le x \le 0.6$) first etching stop layer of 0.3 μm and a first conductivity type GaAs second etching stop layer of 0.3 μm were epitaxially grown to form a sacrificial layer 12. In addition, an epitaxial wafer 20 was provided with a light emitting device structure, which was a semiconductor functional layer (epitaxial functional layer) 18, in which a first conductivity type $(Al_yGa_{1-y})_xIn_{1-x}P$ ($0.4 \le x \le 0.6$, $0 < y \le 1$) first cladding layer 13 of 1.0 μm, a non-doped $(Al_yGa_{1-y})_xIn_{1-x}P$ ($0.4 \le x \le 0.6$, $0 \le y \le 0.6$) active layer 14, a second conductivity type $(Al_yGa_{1-y})_xIn_{1-x}P$ ($0.4 \le x \le 0.6$, $0 < y \le 1$) second cladding layer 15 of 1.0 μm, the second conductivity type GaInP intermediate layer (not shown) of 0.1 μm, and a second conductivity type GaP window layer 16 of 4 μm were grown sequentially (FIG. 1).

Then, a device isolation step was performed to form a device isolation groove 21 by forming a resist mask by a photolithography method and by etching from the first cladding layer 13 to the Gap window layer 16 by dry etching using chlorine-based plasma (FIG. 2).

Next, a $SiO_2$ film was formed as a passivation film 22 on a surface of the window layer 16 and inside the device isolation groove 21 (FIG. 3), and the passivation film 22 ($SiO_2$ film) in a region other than the device isolation groove 21 was removed (FIG. 4).

Then, the epitaxial wafer 20 was spin-coated with benzocyclobutene (BCB) as a thermosetting bonding material 24 (FIG. 5), and a sapphire wafer, which is the to-be-bonded substrate 31, is stacked facing each other and bonded by thermocompression, thereby producing a bonded substrate (epitaxial bonded substrate) 30 by bonding the epitaxial wafer 20 and the sapphire wafer 31 via the BCB 24. When the BCB was applied by spin coating, a designed film thickness was 0.6 μm (FIG. 6). After the temperature reached 150° C., the softening point of the BCB, the temperature was lowered to room temperature, and bonding was performed. Then, the $SiO_2$ film inside the device isolation groove 21 was etched using a fluorine-based solution (FIG. 7). Then, the sacrificial layer 12 was etched using the fluorine-based solution, thereby separating the GaAs starting substrate 11 (FIG. 8). Subsequently, the resist mask was formed by the photolithography method and a part of the second cladding layer 15 was exposed by a dry etching method using a chlorine-based plasma (FIG. 9).

Then, a $SiO_2$ film was formed on the surface as a passivation film 42 and was processed to cover an edge portion of the device isolation groove 21 and a side surface of the exposed active layer 14 and to expose a part of the first cladding layer 13 and the second cladding layer 15 (FIG. 10).

Next, an AuBe alloy layer was provided in a region of 0.1 μm near a P-type layer, and an AuGe alloy layer was provided in a region of 0.2 μm near an N-type layer as the electrodes 44 in the exposed portion of the $SiO_2$ film which was the passivation film 42. An ohmic contact was realized by performing heat treatment (FIG. 11).

Example 2

To begin with, as shown in FIG. 12, after laminating a first conductivity type GaAs buffer layer on a first conductivity type GaAs starting substrate 11, a first conductivity type $Ga_xIn_{1-x}P$ ($0.4 \le x \le 0.6$) first etching stop layer of 0.3 μm and a first conductivity type GaAs second etching stop layer of 0.3 μm were epitaxially grown to form a sacrificial layer 12. In addition, an epitaxial wafer 20 was provided with a light emitting device structure, which was a semiconductor functional layer (epitaxial functional layer) 18, in which a first conductivity type $(Al_yGa_{1-y})_xIn_{1-x}P$ ($0.4 \le x \le 0.6$, $0 < y \le 1$) first cladding layer 13 of 1.0 μm, a non-doped $(Al_yGa_{1-y})_xIn_{1-x}P$ ($0.4 \le x \le 0.6$, $0 \le y \le 0.6$) active layer 14, a second conductivity type $(Al_yGa_{1-y})_xIn_{1-x}P$ ($0.4 \le x \le 0.6$, $0 < y \le 1$) second cladding layer 15 of 1.0 μm, a second conductivity type GaInP intermediate layer (not shown) of 0.1 μm, and a second conductivity type GaP window layer 16 of 4 μm were grown sequentially (FIG. 12).

Then, a device isolation step was performed to form a device isolation groove 21 by forming a resist mask by a photolithography method, and by etching from the first cladding layer 13 to the Gap window layer 16 by dry etching using chlorine-based plasma (FIG. 13).

Then, by spin coating benzocyclobutene (BCB) on the epitaxial wafer 20, the BCB was supplied on a surface of the wafer and inside the device isolation groove 21 (FIG. 14), and the BCB film was cured by applying heat at 250° C. for 1 hour (curable bonding material 25).

Then, the curable bonding material (cured BCB portion) 25 of a part of the device isolation groove 21 was removed to expose the sacrificial layer 12 by a photolithography method (FIG. 15).

Next, a $SiO_2$ film was formed as a passivation film 22 on a surface of the window layer 16 and inside the device isolation groove 21 (FIG. 16), and the passivation film 22 ($SiO_2$ film) in a region other than the device isolation groove 21 was removed (FIG. 17).

Then, benzocyclobutene (BCB), as a thermosetting bonding material 24, was spin-coated on the epitaxial wafer 20 (FIG. 18), then such as a sapphire wafer, which is the to-be-bonded substrate 31, is stacked facing each other and bonded by thermocompression, thereby producing a bonded substrate (epitaxial bonded substrate) 50 by bonding the epitaxial wafer 20 and the sapphire wafer 31 via the BCB 24. When the BCB was applied by spin coating, a designed film thickness was 0.6 μm (FIG. 19).

Then, the passivation film 22 ($SiO_2$ film) inside the device isolation groove 21 was etched using a fluorine-based solution (FIG. 20).

Then, the sacrificial layer 12 was etched using the fluorine-based solution, thereby separating the GaAs starting substrate 11 (FIG. 21). Subsequently, the resist mask was formed by the photolithography method, and a part of the second cladding layer 15 was exposed by a dry etching method using a chlorine-based plasma (FIG. 22).

Then, the curable bonding material 25 (BCB cured portion) in the spike shape was removed by the liquid flow at a pressure of about 5 kgf/cm$^2$ (FIG. 23).

The $SiO_2$ film was formed on the surface as a passivation film 42 and was processed to cover a side surface of the exposed active layer 14, and to expose a part of the first cladding layer 13 and the second cladding layer 15 (FIG. 24).

Next, an AuBe alloy layer was provided in a region of 0.1 μm near a P-type layer, and an AuGe alloy layer was provided in a region of 0.2 μm near an N-type layer as the electrodes 44 in the exposed portion of the $SiO_2$ film which was the passivation film 42. An ohmic contact was realized by performing heat treatment (FIG. 25).

Example 3

To begin with, as shown in FIG. 26, after laminating a first conductivity type GaAs buffer layer on a first conductivity type GaAs starting substrate 11, a first conductivity type $Ga_xIn_{1-x}P$ ($0.4 \leq x \leq 0.6$) first etching stop layer of 0.3 μm, a first conductivity type GaAs second etching stop layer of 0.3 μm were epitaxially grown to form a sacrificial layer 12. In addition, an epitaxial wafer 20 was provided with a light emitting device structure, which was a semiconductor functional layer (epitaxial functional layer) 18, in which a first conductivity type $(Al_yGa_{1-y})_xIn_{1-x}P$ ($0.4 \leq x \leq 0.6$, $0 < y \leq 1$) first cladding layer 13 of 1.0 μm, a non-doped $(Al_yGa_{1-y})_xIn_{1-x}P$ ($0.4 \leq x \leq 0.6$, $0 \leq y \leq 0.6$) active layer 14, a second conductivity type $(Al_yGa_{1-y})_xIn_{1-x}P$ ($0.4 \leq x \leq 0.6$, $0 < y \leq 1$) second cladding layer 15 of 1.0 μm, a second conductivity type GaInP intermediate layer (not shown) of 0.1 μm, a second conductivity type GaP window layer 16 of 4 μm were grown Sequentially (FIG. 26).

A device isolation step was performed to form a device isolation groove 21 by forming a resist mask by a photolithography method, and by etching from the first cladding layer 13 to the Gap window layer 16 by dry etching using chlorine-based plasma (FIG. 27).

By spin coating benzocyclobutene (BCB) on the epitaxial wafer 20, the BCB was supplied on a surface of the wafer, and a part of inside the device isolation groove 21 (FIG. 28), and the BCB film was cured by applying heat at 250° C. for 1 hour (curable bonding material 25).

The resist mask was formed by the photolithography method, and the curable bonding material (cured BCB portion) 25 of a part of the device isolation groove 21 was removed to expose the sacrificial layer 12 by dry etching using fluorine-based plasma (FIG. 29).

Next, a $SiO_2$ film was formed as a passivation film 22 on a surface of the window layer 16 and inside the device isolation groove 21 (FIG. 30), and the passivation film 22 ($SiO_2$ film) in a region other than the device isolation groove 21 was removed (FIG. 31).

Then, benzocyclobutene (BCB), as a thermosetting bonding material 24, was spin-coated on the epitaxial wafer 20 (FIG. 32), then such as a sapphire wafer, which is the to-be-bonded substrate 31, is stacked facing each other and bonded by thermocompression, thereby producing a bonded substrate (epitaxial bonded substrate) 60 by bonding the epitaxial wafer 20 and the sapphire wafer 31 via the BCB 24. When the BCB was applied by spin coating, a designed film thickness was 0.6 μm (FIG. 33).

Then, the passivation film 22 ($SiO_2$ film) inside the device isolation groove 21 was etched using a fluorine-based solution (FIG. 34).

Then, the sacrificial layer 12 was etched using the fluorine-based solution, thereby separating the GaAs starting substrate 11 (FIG. 35).

Then, the resist mask was formed, and a part of the second cladding layer 15 was exposed by a dry etching method using a chlorine-based plasma (FIG. 36).

The $SiO_2$ film was formed on the surface as a passivation film 42, and was processed to cover an edge portion of the device isolation groove 21 and a side surface of the exposed active layer 14, and to expose a part of the first cladding layer 13 and the second cladding layer 15 (FIG. 37).

Next, an AuBe alloy layer was provided in a region of 0.1 μm near a P-type layer, and an AuGe alloy layer was provided in a region of 0.2 μm near an N-type layer as the electrodes 44 in the exposed portion of the $SiO_2$ film which was the passivation film 42. An ohmic contact was realized by performing heat treatment (FIG. 38).

Example 4

To begin with, as shown in FIG. 39, after laminating a first conductivity type GaAs buffer layer on a first conductivity type GaAs starting substrate 11, a first conductivity type $Ga_xIn_{1-x}P$ ($0.4 \leq x \leq 0.6$) first etching stop layer of 0.3 μm and a first conductivity type GaAs second etching stop layer of 0.3 μm were epitaxially grown to form a sacrificial layer 12. In addition, an epitaxial wafer was provided with a light emitting device structure, which was a semiconductor functional layer (epitaxial functional layer) 18, in which a first conductivity type $(Al_yGa_{1-y})_xIn_{1-x}P$ ($0.4 \leq x \leq 0.6$, $0 < y \leq 1$) first cladding layer 13 of 1.0 μm, a non-doped $(Al_yGa_{1-y})_xIn_{1-x}P$ ($0.4 \leq x \leq 0.6$, $0 \leq y \leq 0.6$) active layer 14, a second conductivity type $(Al_yGa_{1-y})_xIn_{1-x}P$ ($0.4 \leq x \leq 0.6$, $0 < y \leq 1$) second cladding layer 15 of 1.0 μm, a second conductivity type GaInP intermediate layer (not shown) of 0.1 μm, and a second conductivity type GaP window layer 16 of 4 μm were grown sequentially (FIG. 39).

A device isolation step was performed to form a device isolation groove 21 by forming a resist mask by a photolithography method and by etching from the first cladding layer 13 to the Gap window layer 16 by dry etching using chlorine-based plasma (FIG. 40).

By spin coating benzocyclobutene (BCB) on the epitaxial wafer 20, the BCB was supplied on a surface of the wafer and inside (wall surface) the device isolation groove 21 (FIG. 41), and the BCB film was cured by applying heat at 250° C. for 1 hour (curable bonding material 25).

The resist mask was formed by the photolithography method, and the curable bonding material 25 (cured BCB portion) of a part of the device isolation groove was removed to expose the sacrificial layer 12 by dry etching using fluorine-based plasma (FIG. 42).

Next, a $SiO_2$ film was formed as a passivation film 22 on a surface of the window layer 16 and in the device isolation groove 21 so as to cover the sacrificial layer 12 (FIG. 43), and the passivation film 22 ($SiO_2$ film) in a region other than the device isolation groove 21 was removed (FIG. 44).

Then, by spin coating benzocyclobutene (BCB), as a thermosetting bonding material 24, on the epitaxial wafer 20, the BCB was supplied on a surface of the wafer and inside a part of the device isolation groove 21 (FIG. 45), and then such as a sapphire wafer, which is the to-be-bonded substrate 31, is stacked facing each other and bonded by thermocompression, thereby producing a bonded substrate (epitaxial bonded substrate) 70 by bonding the epitaxial wafer 20 and the sapphire wafer 31 via the BCB 24. When the BCB was applied by spin coating, a designed film thickness was 0.6 μm (FIG. 46).

Then, the passivation film 22 ($SiO_2$ film) inside the device isolation groove 21 was etched using a fluorine-based solution (FIG. 47).

Then, the sacrificial layer 12 was etched using the fluorine-based solution, thereby separating the GaAs starting substrate 11 (FIG. 48).

Then, the resist mask was formed, and a part of the second cladding layer 15 was exposed by a dry etching method using a chlorine-based plasma (FIG. 49).

A BCB cured portion in the spike shape was removed by the liquid flow at a pressure of about 5 $kgf/cm^2$ (FIG. 50).

The $SiO_2$ film was formed on the surface as a passivation film 42 and was processed to cover a side surface of the exposed active layer and to expose a part of the first cladding layer 13 and the second cladding layer 15 (FIG. 51).

Next, an AuBe alloy layer was provided in a region of 0.1 μm near a P-type layer, and an AuGe alloy layer was provided in a region of 0.2 μm near an N-type layer as the electrodes 44 in the exposed portion of the $SiO_2$ film which was the passivation film 42. An ohmic contact was realized by performing heat treatment (FIG. 52).

Comparative Example

As shown in FIG. 53, after laminating a first conductivity type GaAs buffer layer on a first conductivity type GaAs starting substrate 111, a first conductivity type $Ga_xIn_{1-x}P$ ($0.4 \le x \le 0.6$) first etching stop layer of 0.3 μm and a first conductivity type GaAs second etching stop layer of 0.3 μm were epitaxially grown to form a sacrificial layer 112. In addition, an epitaxial wafer 120 was provided with a light emitting device structure, which was a semiconductor functional layer (epitaxial functional layer) 118, in which a first conductivity type $(Al_yGa_{1-y})_xIn_{1-x}P$ ($0.4 \le x \le 0.6$, $0 < y \le 1$) first cladding layer 113 of 1.0 μm, a non-doped $(Al_yGa_{1-y})_xIn_{1-x}P$ ($0.4 \le x \le 0.6$, $0 \le y \le 0.6$) active layer 114, a second conductivity type $(Al_yGa_{1-y})_xIn_{1-x}P$ ($0.4 \le x \le 0.6$, $0 < y \le 1$) second cladding layer 115 of 1.0 μm, a second conductivity type GaInP intermediate layer (not shown) of 0.1 μm, and a second conductivity type Gap window layer 116 of 4 μm were grown sequentially (FIG. 53).

A device isolation step was performed to form a device isolation groove 121 by forming a resist mask by a photolithography method and by etching from the first cladding layer 113 to the Gap window layer 116 by dry etching using chlorine-based plasma (FIG. 54). This exposed a surface 112*a* of the sacrificial layer 112.

Then, BCB 122 was spin-coated on a sapphire wafer 131 (FIG. 55), and an epitaxial wafer, in which a device isolation groove 121 was formed, was stacked facing each other and bonded by thermocompression, thereby producing an epitaxial bonded substrate by bonding the epitaxial wafer and the sapphire wafer via the BCB. When the BCB was applied by spin coating, a designed film thickness was 0.6 μm (FIG. 56).

When bonding, an amount of BCB bonding agent 122, which penetrated the device isolation groove 121, was uncontrollable; thus, some areas were partially filled, while some regions were filled by the BCB bonding agent 122 up to the surface of the exposed sacrificial layer 112 (see FIG. 56).

The sacrificial layer 112 was removed by wet etching, and the GaAs starting substrate 111 and the epitaxial layer were separated. The area where the BCB bonding agent 122 filled the device isolation groove 121 was not penetrated by a sacrificial layer etchant, thus, the sacrificial layer 112 was not etched and partially remained (FIG. 57). The partially remained sacrificial layer was shown by reference sign 162.

When the GaAs starting substrate 111 was separated from the epitaxial layer, a part of the GaAs starting substrate 111 remained, where the sacrificial layer 112 was not etched (FIG. 58). The part of the partially remaining starting substrate was shown by reference sign 161.

Then, a part of the BCB 122 filling the device isolation groove 121 was removed to form an isolation groove (FIG. 59).

A part of the region of the first cladding layer 113 and the active layer 114 was removed to expose the second cladding layer 115 (FIG. 60). After exposing the second cladding layer 115, the BCB bonding agent 122 in spike shape, was selectively removed by a lift-off method (FIG. 61). Then, a $SiO_2$ film was formed as a passivation film 42 on a surface and processed to cover a device isolation edge portion and a side surface of the exposed active layer 114 and to expose a part of the first cladding layer 113 and the second cladding layer 115 (FIG. 62). At this time, a part 192 of the $SiO_2$ film adhered to the remained starting substrate 161.

Next, an AuBe alloy layer was provided in a region of 0.1 μm near a P-type layer, and an AuGe alloy layer was provided in a region of 0.2 μm near an N-type layer as the electrodes 144 in the exposed portion of the $SiO_2$ film. An ohmic contact was realized by performing heat treatment (FIG. 63). At this time, a part 194 of the electrode material adhered to the remaining starting substrate 161.

Comparison Between Examples and Comparative Example

An area, where the starting substrate (GaAs) did not adhere to the epitaxial layer after the sacrificial layer etching, and the epitaxial layer and the starting substrate were completely separated, is defined as a good area, and a ratio of the good area to a design area is defined as a yield and a comparison thereof between Examples and Comparative Example is shown in FIG. 64.

As can be seen by FIG. 64, in the case of implementations of Examples, all Examples show separation good areas of 90% or more. On the other hand, the yield is significantly decreased in Comparative Example. This difference in the yields is also due to the difference in sacrificial layer etching time because of the presence of the device isolation groove. All Examples, in which the isolation grooves were provided, had the sacrificial layer etching time of 1 hour or shorter. On the other hand, the sacrificial layer etching time in Comparative Example required several tens of hours at room temperature.

In Examples, the etchant penetrates easily via the device isolation groove, thus, the etching proceeds simultaneously on an entire plane of the wafer, thus, the uneven distribution of the stress is small in the process of the sacrificial layer etching, and thus the epitaxial layer is not easily destroyed. Consequently, the yield after the sacrificial layer etching is excellent.

On the other hand, in Comparative Example, the etching proceeds from the outer circumference of the wafer, so the unevenly distributed stress in the process of the sacrificial layer etching tends to be applied to the epitaxial layer. As a result, the epitaxial layer is prone to generate such a crack, resulting in a decrease in yield.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a bonded semiconductor wafer, the method comprising the steps of:

epitaxially growing a sacrificial layer on a starting substrate;

manufacturing an epitaxial wafer by epitaxially growing an epitaxial layer having a semiconductor functional layer on the sacrificial layer;

forming a device isolation groove in a partial region of the epitaxial wafer by a selective etching method so as to expose the sacrificial layer;

forming a passivation film on at least an exposed surface of the sacrificial layer in the device isolation groove;

producing a bonded substrate by bonding the epitaxial layer of the epitaxial wafer to a to-be-bonded substrate being transparent to visible light via a thermosetting bonding material;

removing the passivation film of the bonded substrate by etching; and separating the starting substrate and the epitaxial layer by etching the sacrificial layer by supplying an etchant to the device isolation groove of the bonded substrate.

2. The method for manufacturing a bonded semiconductor wafer according to claim 1, wherein the to-be-bonded substrate is made of any one of sapphire, synthetic quartz, quartz, glass, SiC, $LiTaO_3$, and $LiNbO_3$.

3. The method for manufacturing a bonded semiconductor wafer according to claim 2, wherein the thermosetting bonding material is made of any one or more kinds of silicone resin, epoxy resin, benzocyclobutene, spin-on-glass, polyimide, and fluororesin.

4. The method for manufacturing a bonded semiconductor wafer according to claim 3, wherein a thickness of the thermosetting bonding material is 0.01 μm or more and 0.6 μm or less.

5. The method for manufacturing a bonded semiconductor wafer according to claim 4, wherein the thermosetting bonding material is not thermally cured.

6. The method for manufacturing a bonded semiconductor wafer according to claim 3, wherein the thermosetting bonding material is not thermally cured.

7. The method for manufacturing a bonded semiconductor wafer according to claim 2, wherein a thickness of the thermosetting bonding material is 0.01 μm or more and 0.6 μm or less.

8. The method for manufacturing a bonded semiconductor wafer according to claim 7, wherein the thermosetting bonding material is not thermally cured.

9. The method for manufacturing a bonded semiconductor wafer according to claim 2, wherein the thermosetting bonding material is not thermally cured.

10. The method for manufacturing a bonded semiconductor wafer according to claim 1, wherein the thermosetting bonding material is made of any one or more kinds of silicone resin, epoxy resin, benzocyclobutene, spin-on-glass, polyimide, and fluororesin.

11. The method for manufacturing a bonded semiconductor wafer according to claim 10, wherein a thickness of the thermosetting bonding material is 0.01 μm or more and 0.6 μm or less.

12. The method for manufacturing a bonded semiconductor wafer according to claim 11, wherein the thermosetting bonding material is not thermally cured.

13. The method for manufacturing a bonded semiconductor wafer according to claim 10, wherein the thermosetting bonding material is not thermally cured.

14. The method for manufacturing a bonded semiconductor wafer according to claim 1, wherein a thickness of the thermosetting bonding material is 0.01 um or more and 0.6 μm or less.

15. The method for manufacturing a bonded semiconductor wafer according to claim 14, wherein the thermosetting bonding material is not thermally cured.

16. The method for manufacturing a bonded semiconductor wafer according to claim 1, wherein the thermosetting bonding material is not thermally cured.

17. The method for manufacturing a bonded semiconductor wafer according to claim 1, wherein the passivation film is a silicon oxide film.

18. The method for manufacturing a bonded semiconductor wafer according to claim 1, wherein the bonded semiconductor wafer is for a micro-LED.

* * * * *